(12) United States Patent
Kawamura et al.

(10) Patent No.: US 8,802,511 B2
(45) Date of Patent: Aug. 12, 2014

(54) DISPLAY DEVICE

(71) Applicant: Takeshi Sato, Kokubunji (JP)

(72) Inventors: Tetsufumi Kawamura, Kokubunji (JP); Takeshi Sato, Kokubunji (JP); Mutsuko Hatano, Kokubunji (JP); Yoshiaki Toyota, Kokubunji (JP)

(73) Assignees: Japan Display Inc., Tokyo (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 0 days.

(21) Appl. No.: 14/106,287

(22) Filed: Dec. 13, 2013

(65) Prior Publication Data
US 2014/0106490 A1 Apr. 17, 2014

Related U.S. Application Data

(60) Continuation of application No. 13/537,462, filed on Jun. 29, 2012, now Pat. No. 8,629,451, which is a division of application No. 12/003,462, filed on Dec. 26, 2007, now Pat. No. 8,242,505.

(30) Foreign Application Priority Data

Jan. 16, 2007 (JP) .................... 2007-006570

(51) Int. Cl.
H01L 21/00 (2006.01)
(52) U.S. Cl.
USPC ........................................... 438/151; 438/48
(58) Field of Classification Search
USPC ............................ 438/149–161, 48
See application file for complete search history.

(56) References Cited

U.S. PATENT DOCUMENTS

| 6,924,867 B2 | 8/2005 | Hinata |
| 7,799,619 B2 | 9/2010 | Wang |
| 8,513,054 B2 * | 8/2013 | Sasaki et al. ............. 438/151 |
| 8,518,755 B2 * | 8/2013 | Yamazaki et al. ......... 438/149 |

(Continued)

FOREIGN PATENT DOCUMENTS

| JP | 62-145247 | 6/1987 |
| JP | 8-15721 | 1/1996 |

(Continued)

OTHER PUBLICATIONS

Extended European Search Report mailed Apr. 19, 2010.

(Continued)

Primary Examiner — Cuong Q Nguyen
(74) Attorney, Agent, or Firm — Juan Carlos A. Marquez; Morris, Manning & Martin, LLP

(57) ABSTRACT

A display device for improving an aperture ratio of the pixel is provided. In the display device, a transparent oxide layer, an insulating film, and a conductive layer are sequentially stacked on a pixel region on a substrate, the conductive layer has a gate electrode of a thin film transistor connected to a gate signal line, and a region of the transparent oxide layer other than at least a channel region portion directly below the gate electrode is converted into an electrically conductive region, and a source signal line, a source region portion of the thin film transistor connected to the source signal line, a pixel electrode, and a drain region portion of the thin film transistor connected to the pixel electrode are formed from the conductive region.

8 Claims, 35 Drawing Sheets

(56) References Cited

U.S. PATENT DOCUMENTS

| | | | |
|---|---|---|---|
| 8,530,289 B2 * | 9/2013 | Yamazaki | ............ 438/161 |
| 2002/0056838 A1 | 5/2002 | Ogawa | |
| 2004/0266071 A1 | 12/2004 | Huang et al. | |

FOREIGN PATENT DOCUMENTS

| | | |
|---|---|---|
| JP | H09-269503 A | 10/1997 |
| JP | 2001-76885 | 3/2001 |
| JP | 2003-050405 | 2/2003 |
| JP | 2004-319673 A | 11/2004 |
| TW | 538293 | 6/2003 |

OTHER PUBLICATIONS

Office Action dated Dec. 27, 2011, for corresponding Taiwanese Patent Application No. 96142729.

Office Action from the Korean Patent Office in the counterpart application No. 2007-0120116 dated Feb. 25, 2014 with 2 pages of partial English translation.

* cited by examiner

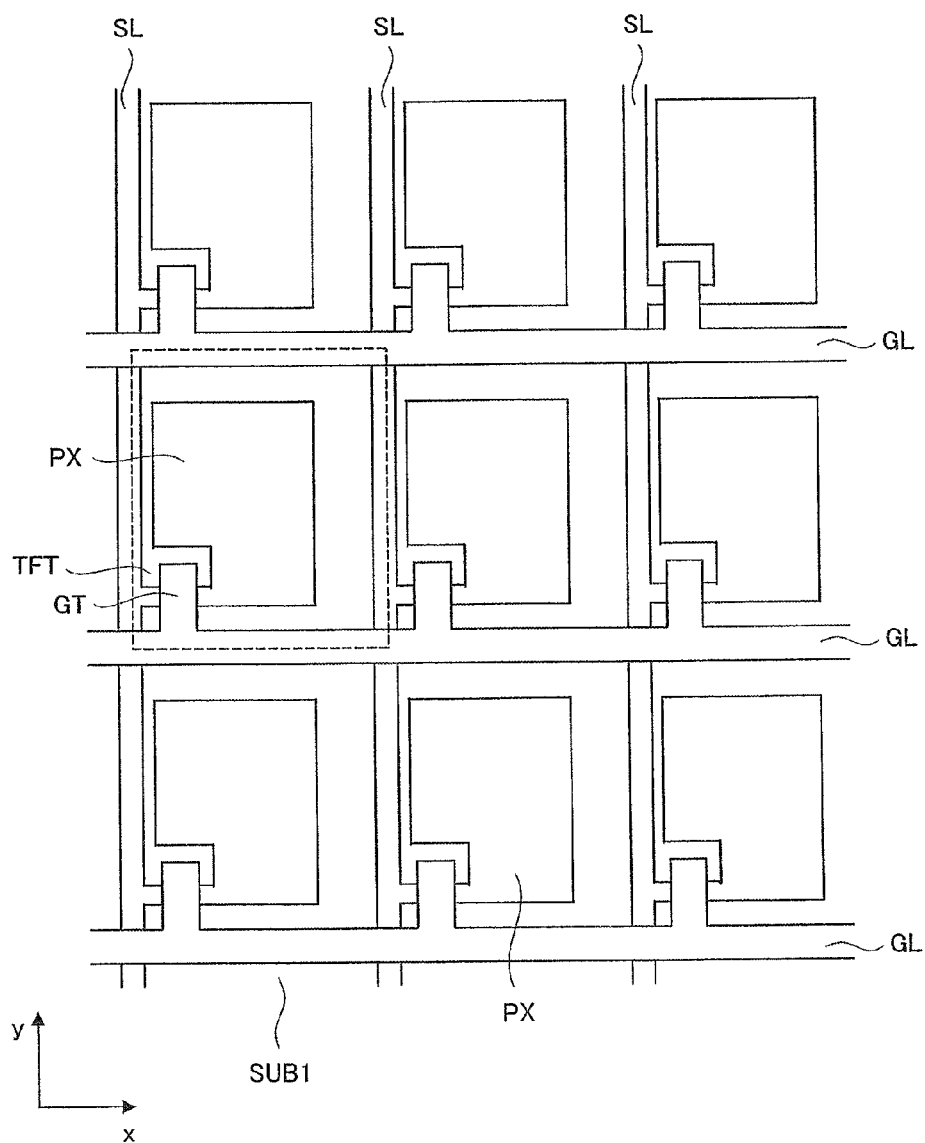

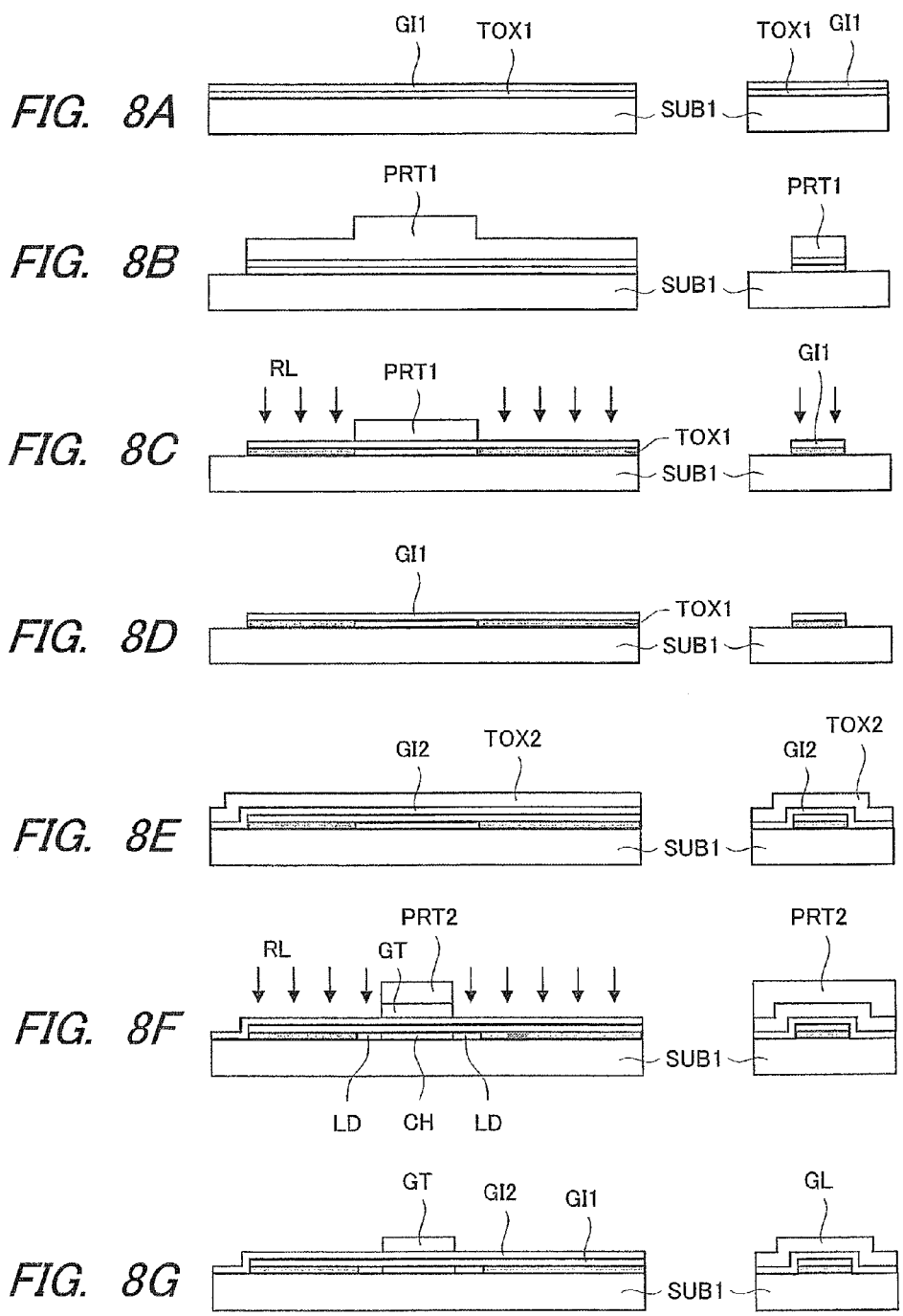

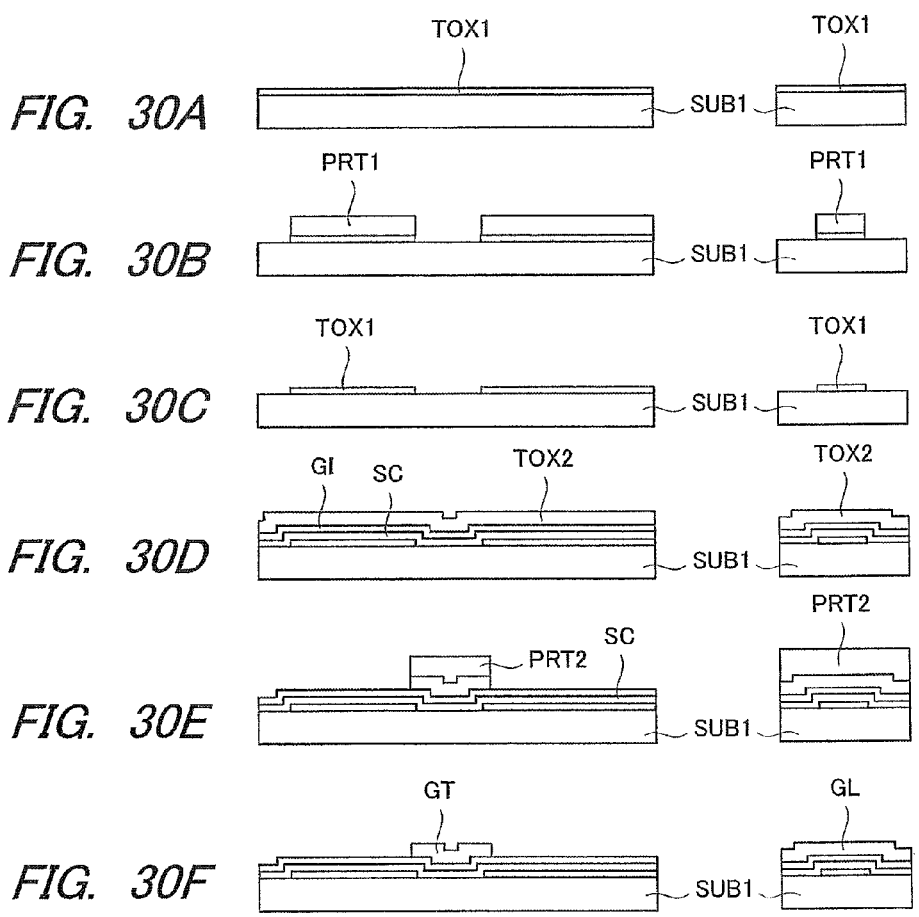

DISPLAY DEVICE

CROSS-REFERENCE TO RELATED APPLICATIONS

This application is a Continuation of U.S. application Ser. No. 13/537,462, filed Jun. 29, 2012, which is a Divisional of U.S. application Ser. No. 12/003,462 filed on Dec. 26, 2007. Priority is claimed based on U.S. application Ser. No. 13/537,462, filed Jun. 29, 2012 and U.S. application Ser. No. 12/003,462 filed on Dec. 26, 2007, which claims priority from Japanese application JP 2007-006570 filed on Jan. 16, 2007, which is hereby incorporated by reference into this application.

TECHNICAL FIELD OF THE INVENTION

The present invention relates to a display device. In particular, it relates to a display device having a thin film transistor in each pixel.

BACKGROUND OF THE INVENTION

For example, in a liquid crystal display device of an active matrix type, substrates are disposed so as to be opposed via liquid crystal, and gate signal lines extending in an x direction are disposed in parallel in a y direction and source signal lines extending in the y direction are disposed in parallel in the x direction on a surface of one of the substrates on a liquid crystal side. Further, a region surrounded by the gate signal lines and the source signal lines corresponds to a pixel region, and the pixel region includes at least a thin film transistor to be turned on by a signal (scanning signal) from the gate signal line and a pixel electrode to which a video signal from the source signal line is supplied via the turned-on thin film transistor.

The thin film transistor, the gate signal line, the source signal line, the pixel electrode and others are formed by stacking a conductive layer, a semiconductor layer, an insulating film and others processed into desired patterns by a selective etching by a photolithography technique on a substrate in a desired sequence.

In the display device thus configured, the reduction in the number of steps for the selective etching by the photolithography technique has been required, and for example, a technique has been known, in which conductive properties are given to predetermined regions of a semiconductor material film formed on a substrate, thereby processing the film into a channel region portion, a source region portion, and a drain region portion of the thin film transistor, and at the same time, forming a pixel electrode connected to the drain region portion (Japanese Patent Application Laid-Open Publication No. 2003-050405 (Patent Document 1)).

SUMMARY OF THE INVENTION

However, in the display device disclosed in Patent Document 1, the source signal line is formed separately from the semiconductor material film, and respective selective etching processes are inevitably required for the formation of these components.

Further, due to the limit of a mask alignment at the time of the formation of the source signal line, it has been difficult to dispose the source signal line at a narrow interval with a pixel electrode formed as a part of the region of the semiconductor material film. Hence, a limit has been imposed on the improvement of an aperture ratio of the pixel.

An object of the present invention is to provide a display device having a configuration capable of reducing the number of manufacturing processes.

Another object of the present invention is to provide a display device capable of achieving the improvement in an aperture ratio of a pixel.

The typical ones of the inventions disclosed in this application will be briefly described as follows.

(1) In a display device according to the present invention, for example, a transparent oxide layer, an insulating film, and a conductive layer are sequentially stacked on a pixel region on a substrate, the conductive layer has a gate electrode of a thin film transistor connected to a gate signal line, and a region of the transparent oxide layer other than at least a channel region portion directly below the gate electrode is converted into an electrically conductive region, and a source signal line, a source region portion of the thin film transistor connected to the source signal line, a pixel electrode, and a drain region portion of the thin film transistor connected to the pixel electrode are formed from the conductive region.

(2) In the display device according to the present invention based on the configuration of (1), the transparent oxide layer is formed on an entire region of the pixel region, and the source signal line, the source region portion of the thin film transistor connected to the source signal line, the pixel electrode, and the drain region portion of the thin film transistor connected to the pixel electrode are formed by selectively converting regions of the transparent oxide layer into electrically conductive regions.

(3) In the display device according to the present invention based on the configuration of (1), the conductive layer has a counter electrode including a plurality of electrodes overlapped on the pixel electrode and disposed in parallel on the insulating film and a common signal line supplying a signal to each electrode of the counter electrode.

(4) In the display device according to the present invention based on the configuration of (1), the insulating film is formed on an entire region of the pixel region.

(5) In the display device according to the present invention based on the configuration of (1), the conductive layer is constituted of a metal layer.

(6) In the display device according to the present invention based on the configuration of (1), the conductive layer is constituted of an ITO film.

(7) In the display device according to the present invention based on the configuration of (1), the conductive layer is formed by selectively converting the transparent oxide layer formed on an entire region of the pixel region into an electrically conductive layer.

(8) In the display device according to the present invention based on the configuration of (1), LDD region portions with a carrier concentration lower than those of the source region portion and drain region portion are formed in the transparent oxide layer between the channel region portion directly below the gate electrode and the source region portion and between the channel region portion and the drain region portion, respectively.

(9) In the display device according to the present invention based on the configuration of (1), a metal layer is formed on or below a portion of the transparent oxide layer constituting the source signal line.

(10) In a display device according to the present invention, for example, a transparent oxide layer and a metal layer, either of which is taken as an upper layer, are formed on a pixel region on a substrate, and an insulating film and a conductive layer are sequentially stacked thereon, the conductive layer has a gate electrode of a thin film transistor connected to a gate signal line, the metal layer constitutes a source signal line, and a region of the transparent oxide layer other than at least a channel region portion directly below the gate electrode is converted into an electrically conductive region, and a source region portion of the thin film transistor connected to the source signal line, a pixel electrode, and a drain region portion of the thin film transistor connected to the pixel electrode are formed from the conductive region.

(11) In a display device according to the present invention, for example, a transparent oxide layer and a semiconductor layer, either of which is taken as an upper layer, are formed on a pixel region on a substrate, and an insulating film and a conductive layer are sequentially stacked thereon, the conductive layer has a gate electrode of a thin film transistor connected to a gate signal line, an opening portion or a notched portion is formed in a region of the transparent oxide layer corresponding to at least a channel region portion directly below the gate electrode and the transparent oxide layer is converted into an electrically conductive layer, and a source signal line, a source region portion of the thin film transistor connected to the source signal line, a pixel electrode, and a drain region portion of the thin film transistor connected to the pixel electrode are formed from the conductive layer, and the semiconductor layer is formed in the opening portion or the notched portion of the transparent oxide layer and is connected to the source region portion and the drain region portion.

(12) In the display device according to the present invention based on the configuration of (11), the transparent oxide layer is formed on an entire region of the pixel region, and the source signal line, the source region portion of the thin film transistor connected to the source signal line, the pixel electrode, and the drain region portion of the thin film transistor connected to the pixel electrode are formed by selectively converting regions of the transparent oxide layer into electrically conductive layer regions.

(13) In the display device according to the present invention based on the configuration of (11), the conductive layer has a counter electrode including a plurality of electrodes overlapped on the pixel electrode and disposed in parallel on the insulating film and a common signal line supplying a signal to each electrode of the counter electrode.

(14) In the display device according to the present invention based on the configuration of (11), the insulating film is formed on an entire region of the pixel region.

(15) In the display device according to the present invention based on the configuration of (11), the conductive layer is constituted of a metal layer.

(16) In the display device according to the present invention based on the configuration of (11), the conductive layer is constituted of an ITO film.

(17) In the display device according to the present invention based on the configuration of (11), the conductive layer is formed by selectively converting the transparent oxide layer formed on an entire region of the pixel region into an electrically conductive layer.

(18) In the display device according to the present invention based on the configuration of (11), LDD region portions with a carrier concentration lower than those of a source region and a drain region are formed in the transparent oxide layer between a portion directly below the gate electrode and the source region and between the portion and the drain region, respectively.

(19) In the display device according to the present invention based on the configuration of (11), a metal layer is formed on or below a portion of the transparent oxide layer constituting the source signal line.

Note that the present invention is not limited to the foregoing configurations, and various modifications and alterations can be made within the scope of the present invention.

In the display device thus configured, the number of manufacturing processes can be reduced, and at the same time, the aperture ratio of the pixel can be improved.

BRIEF DESCRIPTIONS OF THE DRAWINGS

FIG. 1 is a configuration diagram showing an embodiment of a circuit formed in a liquid crystal display region of a surface on a liquid crystal side of one substrate of the substrates disposed to be opposed to each other via the liquid crystal of a liquid crystal display device;

FIG. 8A is a process drawing showing an embodiment of a manufacturing method of a liquid crystal display device having the pixel shown in FIG. 7;

FIG. 8B is a process drawing showing an embodiment of a manufacturing method of a liquid crystal display device having the pixel shown in FIG. 7;

FIG. 8C is a process drawing showing an embodiment of a manufacturing method of a liquid crystal display device having the pixel shown in FIG. 7;

FIG. 8D is a process drawing showing an embodiment of a manufacturing method of a liquid crystal display device having the pixel shown in FIG. 7;

FIG. 8E is a process drawing showing an embodiment of a manufacturing method of a liquid crystal display device having the pixel shown in FIG. 7;

FIG. 8F is a process drawing showing an embodiment of a manufacturing method of a liquid crystal display device having the pixel shown in FIG. 7;

FIG. 8G is a process drawing showing an embodiment of a manufacturing method of a liquid crystal display device having the pixel shown in FIG. 7;

FIG. 30A is a process drawing showing an embodiment of the manufacturing method of the display device having the pixel shown in FIG. 29A and FIG. 29B;

FIG. 30B is a process drawing showing an embodiment of the manufacturing method of the display device having the pixel shown in FIG. 29A and FIG. 29B;

FIG. 30C is a process drawing showing an embodiment of the manufacturing method of the display device having the pixel shown in FIG. 29A and FIG. 29B;

FIG. 30D is a process drawing showing an embodiment of the manufacturing method of the display device having the pixel shown in FIG. 29A and FIG. 29B;

FIG. 30E is a process drawing showing an embodiment of the manufacturing method of the display device having the pixel shown in FIG. 29A and FIG. 29B;

FIG. 30F is a process drawing showing an embodiment of the manufacturing method of the display device having the pixel shown in FIG. 29A and FIG. 29B;

DESCRIPTIONS OF THE PREFERRED EMBODIMENTS

Hereinafter, embodiments of a display device and a manufacturing method thereof according to the present invention will be described below with reference to the accompanying drawings.

First Embodiment

FIG. 1 is a configuration diagram showing an embodiment of a circuit formed in a liquid crystal display region of a surface on a liquid crystal side of one substrate SUB1 of the substrates disposed to be opposed to each other via the liquid crystal of a liquid crystal display device.

In FIG. 1, source signal lines SL extending in a y direction and disposed in parallel in an x direction and gate signal lines GL isolated from the source signal lines SL, extending in the x direction and disposed in parallel in the y direction are provided. Further, a rectangular region surrounded by these signal lines corresponds to a region of a pixel (shown by a dotted frame in FIG. 1). Accordingly, each of the pixels is disposed in a matrix pattern, and the liquid crystal display region is configured from the pixel group.

A pixel electrode PX constituted of, for example, a transparent electrode is formed across a most part of each pixel region, and the pixel electrode PX is connected to, for example, the source signal line SL adjacent on the left side in FIG. 1 via a thin film transistor TFT. By the on/off driving of the thin film transistor TFT, supplying and non-supplying of the signal from the source signal line SL to the pixel electrode PX are controlled.

In the thin film transistor TFT, a gate electrode GT formed of an extended portion of the gate signal line GL is disposed above the semiconductor layer, and thus the thin film transistor TFT has a so-called top-gate type MIS (Metal Insulator Semiconductor) structure.

Accordingly, by sequentially supplying a signal (scanning signal) to each of the gate signal lines GL, the thin film transistors TFT of each pixel of a pixel column are turned on, and by supplying a video signal to each of the source signal lines SL in accordance with the turning-on timing, the voltage of the video signal is applied to the pixel electrode PX in each pixel of the pixel column.

The liquid crystal display device shown in this embodiment has another substrate (not shown) disposed to be opposed to the substrate SUB1 via the liquid crystal, and a counter electrode common to each pixel is formed on the surface on the liquid crystal side of this substrate. This counter electrode is constituted of, for example, a transparent electrode, and a signal including a voltage to be a reference for the signal (video signal) supplied to the source signal line SL is supplied to the counter electrode. An electric field generated by a difference in potential between the pixel electrode PX and the counter electrode is applied to the liquid crystal, so that the molecules of the liquid crystal are oriented.

Figure 2A:
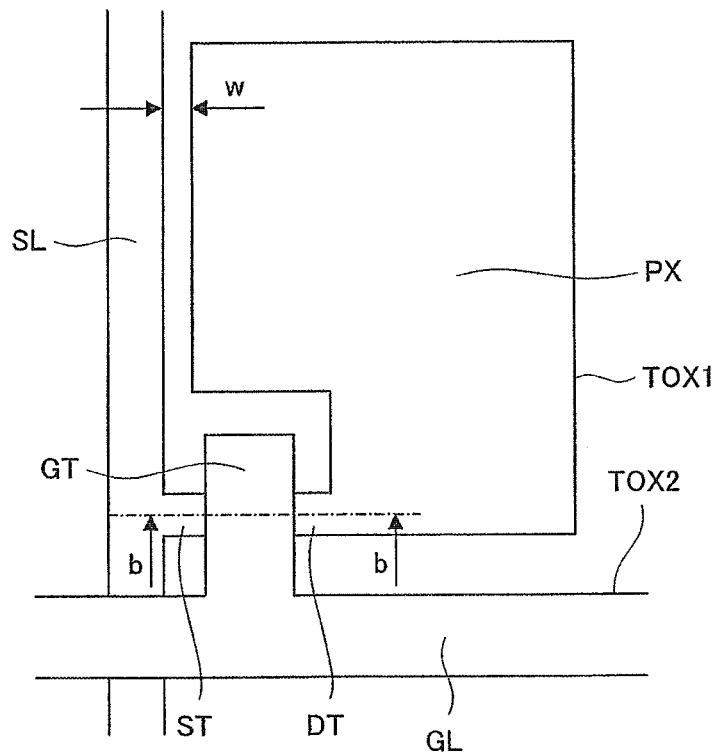
FIG. 2A is a view showing an embodiment of the configuration of one pixel extracted from the pixels shown in FIG. 1.

FIG. 2A is a view showing one pixel extracted from the pixels shown in FIG. 1. Also, FIG. 2B is a cross-sectional view taken along the line b-b of FIG. 2A.

Figure 2B:
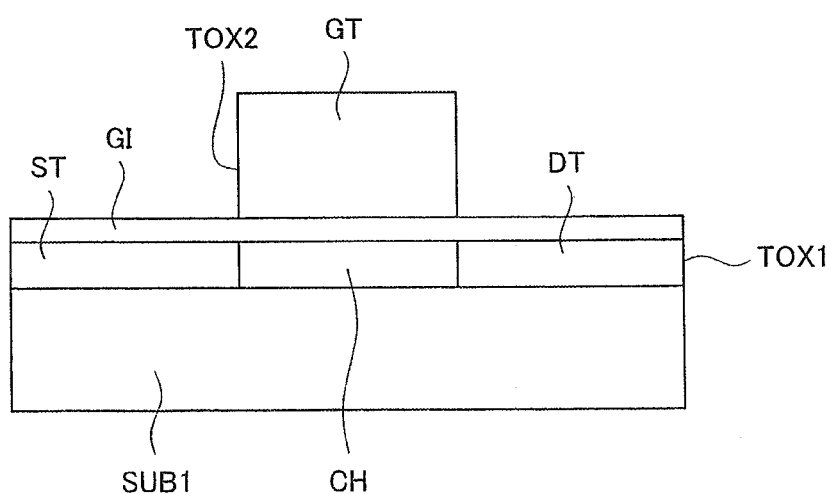
FIG. 2B is a cross-sectional view taken along the line b-b in FIG. 2A.

In FIG. 2A and FIG. 2B, the source signal line SL, a source region portion ST of the thin film transistor TFT, a channel region portion CH (portion directly below the gate electrode GT), a drain region portion DT, and the pixel electrode PX are formed from a first transparent oxide layer TOX1 formed integrally in the same layer.

More specifically, in the first transparent oxide layer TOX1, the channel region portion CH is formed as a film with a low carrier concentration and a high sheet resistance (semiconductor layer), and the forming regions of the source signal line SL, the source region portion ST of the thin film transistor TFT, the drain region portion DT, and the pixel electrode PX are formed as a film with a high carrier concentration and a low sheet resistance (conductive layers). In this case, for example, these components can be formed so that the sheet resistance becomes higher in order of the source signal line SL and the pixel electrode PX<the source region portion ST and the drain region portion DT<the channel region portion CH. Alternatively, these components can be formed so that the sheet resistance becomes higher in order of the source signal line SL<the pixel electrode PX, the source region portion ST and the drain region portion DT<the channel region portion CH. In the latter case, it is possible to achieve the advantage that carrier concentration of the pixel electrode PX can be reduced to a relatively low level, and thus the pixel electrode PX can be formed without deteriorating the transparency thereof.

Since the source signal line SL and the pixel electrode PX thus configured are integrally formed from the first transparent oxide layer TOX1 in the same layer, the interval therebetween (shown by w in FIG. 2A) can be reduced to the minimum. This is because, compared with the case where the source signal line SL and the pixel electrode PX are formed in different processes, the problem that the interval therebetween becomes large due to the limit of mask alignment can be solved. As a result, a configuration capable of achieving the improvement of the aperture ratio of the pixel can be realized.

The gate signal line GL and the gate electrode GT of the thin film transistor TFT are integrally formed in the same layer from, for example, a second transparent oxide layer TOX2 such as ITO (Indium Tin Oxide) or ZnO with a high carrier concentration and a low sheet resistance. In this case, the gate signal line GL and the gate electrode GT are not limited to the transparent oxide layer as describe above, and can be formed from, for example, a metal layer. This is because, when the electric resistance of the gate signal line GL is desired to be further reduced, it is appropriate to use a metal layer made of a material corresponding thereto.

Further, the first transparent oxide film TOX1 is formed on the surface of the substrate SUB1, and the upper surface thereof is covered with an insulating film GI. The gate electrode GT is disposed above the channel region portion CH of the first transparent oxide film TOX1 via the insulating film GI. The insulating film GI functions as a gate insulating film of the thin film transistor TFT.

As described above, in the first transparent oxide layer TOX1, the region with a high carrier concentration and the region with a low carrier concentration are separately formed, and the former is formed as a conductive layer and the latter is formed as a semiconductor layer. Therefore, before describing the manufacturing method of the liquid crystal display device, several embodiments in which the region with a high carrier concentration and the region with a low carrier concentration are selectively and separately formed in the transparent oxide layer TOX will be described.

FIG. 3A to FIG. 3D are views each showing an embodiment in which a region with a high carrier concentration is selectively formed in a transparent oxide layer TOX formed on the upper surface of the substrate SUB1.

Figure 3A:
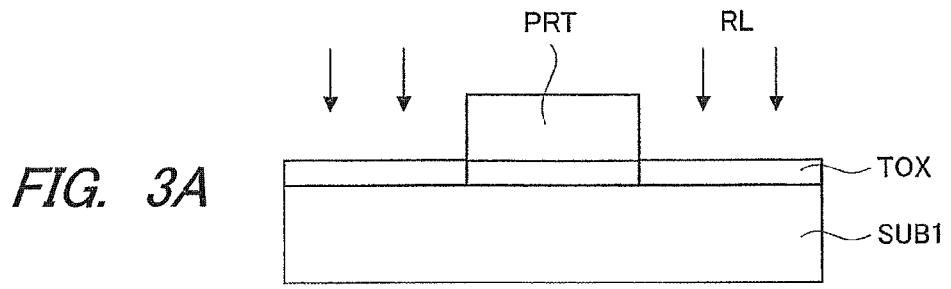
FIG. 3A is a view showing an embodiment in which a region with a high carrier concentration is selectively formed in a transparent oxide layer formed on an upper surface of a substrate.

In FIG. 3A, the transparent oxide layer TOX is formed on the upper surface of the substrate SUB1, and a photoresist film PRT is formed as a mask on the region of the surface of the transparent oxide layer TOX other than the region where the carrier concentration is to be increased.

Then, a laser light RL is irradiated to the transparent oxide layer TOX. As this laser light RL, for example, KrF excimer laser is preferably used, but other light sources are also available. By this means, the region of the transparent oxide layer TOX exposed from the photoresist film PRT is modified in terms of crystallinity by the light, and can be formed as a region with an improved carrier concentration.

Figure 3B:
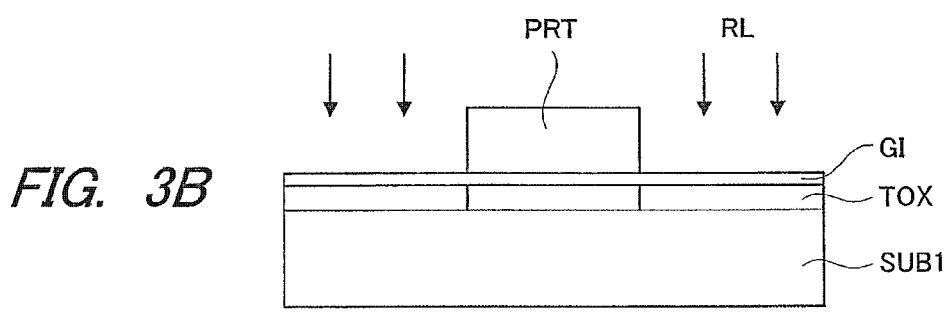
FIG. 3B is a view showing another embodiment in which a region with a high carrier concentration is selectively formed in a transparent oxide layer formed on an upper surface of a substrate.

FIG. 3B shows another embodiment in which the region with a high carrier concentration is selectively formed in the transparent oxide layer TOX by the light irradiation, and this case is different from the case of FIG. 3A in that the insulating film GI is formed on the surface of the transparent oxide layer TOX in advance and the laser light RL is irradiated to the transparent oxide layer TOX through the insulating film GI.

Figure 3C:
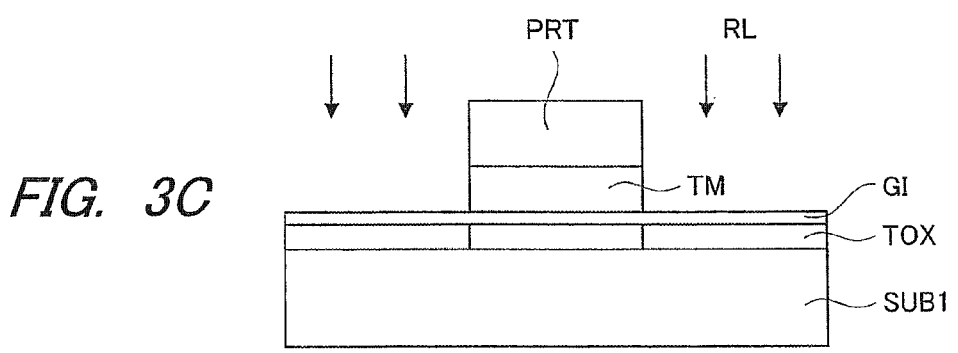
FIG. 3C is a view showing another embodiment in which a region with a high carrier concentration is selectively formed in a transparent oxide layer formed on an upper surface of a substrate.

FIG. 3C shows another embodiment in which the region with a high carrier concentration is selectively formed in the transparent oxide layer TOX by the light irradiation, and this case is different from the case of FIG. 3B in that the transparent oxide layer TOX is covered with the insulating film GI, and the laser light RL is irradiated to the transparent oxide layer TOX with using an electrode TM formed on a part the insulating film GI and the photoresist film PRT stacked on the electrode TM as a mask.

Figure 3D:
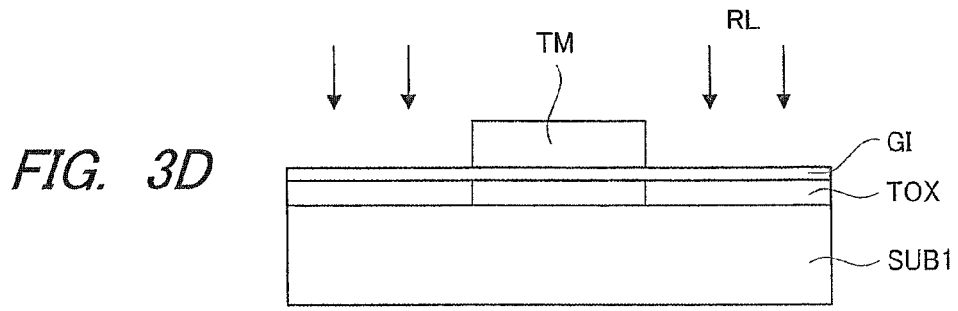
FIG. 3D is a view showing another embodiment in which a region with a high carrier concentration is selectively formed in a transparent oxide layer formed on an upper surface of a substrate.

FIG. 3D shows another embodiment in which the region with a high carrier concentration is selectively formed in the transparent oxide layer TOX by the light irradiation, and this case is different from the case of FIG. 3C in that, after the photoresist film PRT for forming the electrode TM shown in FIG. 3C is removed, a laser light PL is irradiated to the transparent oxide layer TOX with using the electrode TM as a mask.

FIG. 4A to FIG. 4D are views each showing another embodiment in which a region with a high carrier concentration is selectively formed in a transparent oxide layer TOX formed on the upper surface of the substrate SUB1.

Figure 4A:
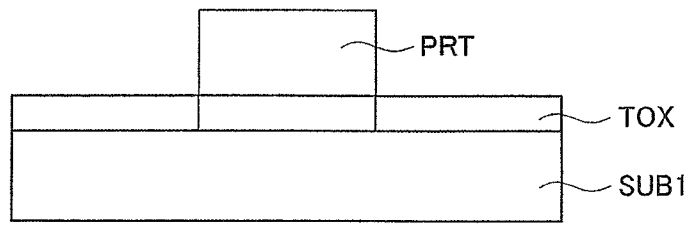
FIG. 4A is a view showing another embodiment in which a region with a high carrier concentration is selectively formed in a transparent oxide layer formed on an upper surface of a substrate.

In FIG. 4A, the transparent oxide layer TOX is formed on the upper surface of the substrate SUB1, and a photoresist film PRT is formed as a mask on the region of the surface of the transparent oxide layer TOX other than the region where the carrier concentration is to be increased.

Then, while leaving the photoresist film PRT on the transparent oxide layer TOX, thermal annealing is performed under the reduction atmosphere.

By this means, the region of the transparent oxide layer TOX exposed from the photoresist film PRT is modified in terms of crystallinity by the thermal annealing, and can be formed as a region with an improved carrier concentration.

Figure 4B:
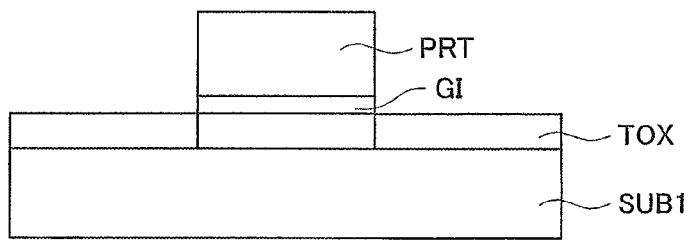
FIG. 4B is a view showing another embodiment in which a region with a high carrier concentration is selectively formed in a transparent oxide layer formed on an upper surface of a substrate.

FIG. 4B shows another embodiment in which the region with a high carrier concentration is selectively formed in the transparent oxide layer TOX by the thermal annealing, and this case is different from the case of FIG. 4B in that the thermal annealing is performed while leaving the insulating film GI selectively formed on the surface of the transparent oxide layer TOX and the photoresist film PRT formed on an upper surface of the insulating film GI and used for selectively forming the insulating film GI.

Figure 4C:
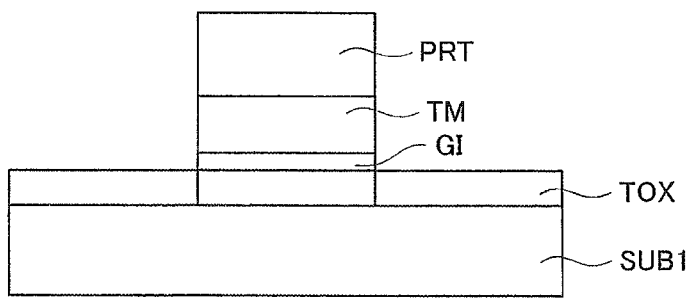
FIG. 4C is a view showing another embodiment in which a region with a high carrier concentration is selectively formed in a transparent oxide layer formed on an upper surface of a substrate.

FIG. 4C shows another embodiment in which the region with a high carrier concentration is selectively formed in the transparent oxide layer TOX by the thermal annealing, and this case is different from the case of FIG. 4C in that the thermal annealing is performed while leaving a stacked body of the insulating film GI and the electrode TM selectively formed on the surface of the transparent oxide layer TOX and the photoresist film PRT formed on an upper surface of the stacked body and used for forming the electrode TM and the insulating film GI.

Figure 4D:
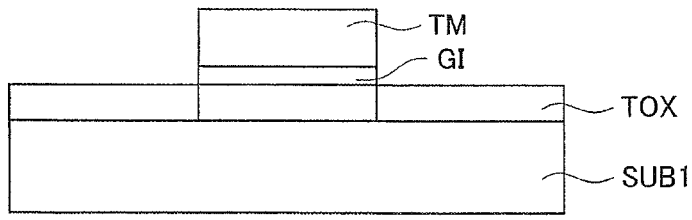
FIG. 4D is a view showing another embodiment in which a region with a high carrier concentration is selectively formed in a transparent oxide layer formed on an upper surface of a substrate.

FIG. 4D shows another embodiment in which the region with a high carrier concentration is selectively formed in the transparent oxide layer TOX by the thermal annealing, and this case is different from the case of FIG. 4C in that thermal annealing is performed in a state where the photoresist film PRT used for forming a stacked body of the insulating film GI and the electrode TM selectively formed on the surface of the transparent oxide layer TOX is removed.

FIG. 5A to FIG. 5D are views each showing another embodiment in which a region with a high carrier concentration is selectively formed in a transparent oxide layer TOX formed on the upper surface of the substrate SUB1.

Figure 5A:
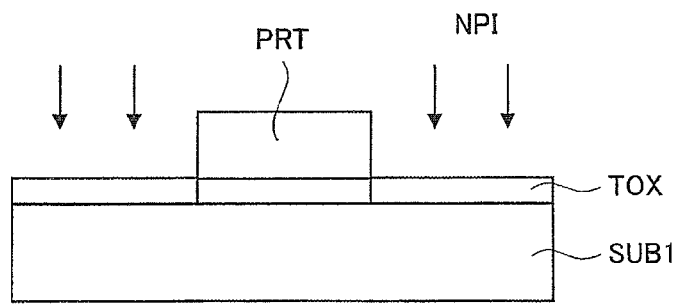
FIG. 5A is a view showing another embodiment in which a region with a high carrier concentration is selectively formed in a transparent oxide layer formed on an upper surface of a substrate.

In FIG. 5A, the transparent oxide layer TOX is formed on the upper surface of the substrate SUB1, and a photoresist film PRT is formed as a mask on the region of the surface of the transparent oxide layer TOX other than the region where the carrier concentration is to be increased.

Then, an impurity ion NPI is implanted into the transparent oxide layer TOX. An n type impurity or a p type impurity is used for the impurity ion NPI according to need.

By this means, the region of the transparent oxide layer TOX exposed from the photoresist film PRT can be formed as a region with an improved carrier concentration by the implantation of the impurity ion NPI.

Figure 5B:
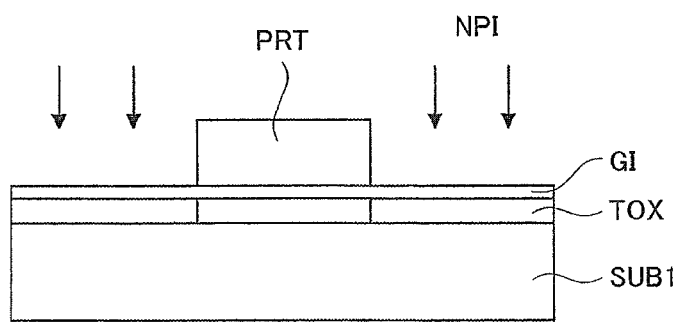
FIG. 5B is a view showing another embodiment in which a region with a high carrier concentration is selectively formed in a transparent oxide layer formed on an upper surface of a substrate.

FIG. 5B is a view showing another embodiment in which the region with a high carrier concentration is formed in the transparent oxide layer TOX formed on the upper surface of the substrate SUB1 by the implantation of the impurity ion NPI, and this case is different from the case of FIG. 5A in that the insulating film GI is formed on the surface of the transparent oxide layer TOX in advance and the implantation of the impurity ion NPI is performed to the transparent oxide layer TOX through the insulating film GI.

Figure 5C:
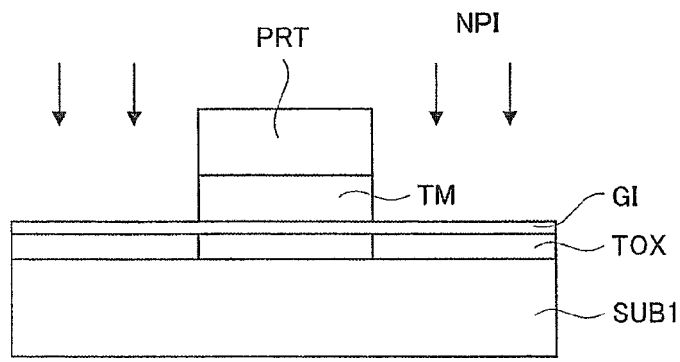
FIG. 5C is a view showing another embodiment in which a region with a high carrier concentration is selectively formed in a transparent oxide layer formed on an upper surface of a substrate.

FIG. 5C shows another embodiment in which the region with a high carrier concentration is formed in the transparent oxide layer TOX by the implantation of the impurity ion NPI, and this case is different from the case of FIG. 5B in that the transparent oxide layer TOX is covered with the insulating film GI, and the implantation of the impurity ion NPI is performed to the transparent oxide layer TOX, with using the electrode TM formed on a part of the region of the insulating film GI and the photoresist film PRT stacked on the electrode TM as a mask.

Figure 5D:
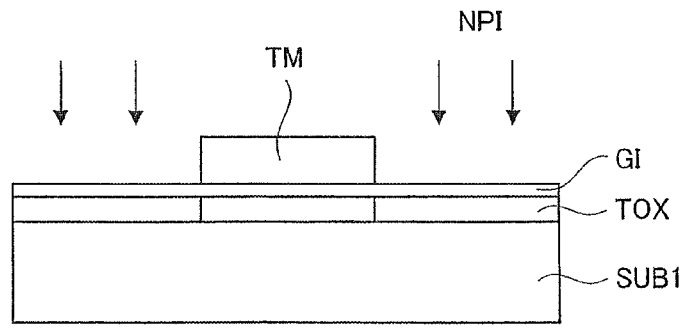
FIG. 5D is a view showing another embodiment in which a region with a high carrier concentration is selectively formed in a transparent oxide layer formed on an upper surface of a substrate.

FIG. 5D shows another embodiment in which the region with a high carrier concentration is formed in the transparent oxide layer TOX by the implantation of the impurity ion NPI, and this case is different from the case of FIG. 5C in that, after the photoresist film PRT for forming the electrode TM shown in FIG. 5C is removed, the implantation of the impurity ion NPI is performed to the transparent oxide layer TOX with using the electrode TM as a mask.

FIG. 6A to FIG. 6D are views each showing another embodiment in which a region with a high carrier concentration is selectively formed in a transparent oxide layer TOX formed on the upper surface of the substrate SUB1.

Figure 6A:
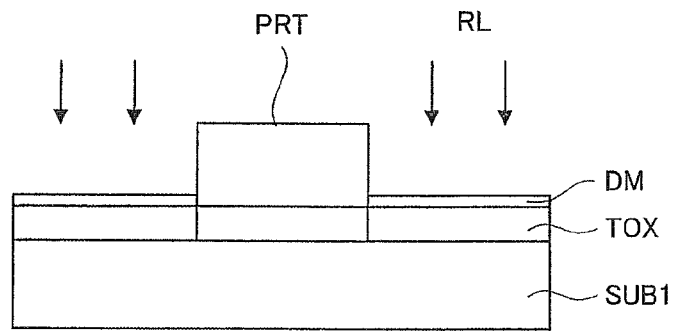
FIG. 6A is a view showing another embodiment in which a region with a high carrier concentration is selectively formed in a transparent oxide layer formed on an upper surface of a substrate.

In FIG. 6A, the transparent oxide layer TOX is formed on the upper surface of the substrate SUB 1, and a photoresist film PRT is formed as a mask on the region of the surface of the transparent oxide layer TOX other than the region where the carrier concentration is to be increased.

Then, a dopant material DM containing an n type or p type impurity is deposited on the surface of the transparent oxide layer TOX exposed from the mask.

Further, the irradiation of a laser light RL (or thermal annealing) is performed to the transparent oxide layer TOX. As the laser light RL, for example, the KrF excimer laser is preferably used, but other light sources are also available.

By this means, the dopant material DM is diffused in the region of the transparent oxide layer TOX exposed from the photoresist film PRT, and the region can be formed as a region with an improved carrier concentration.

Figure 6B:
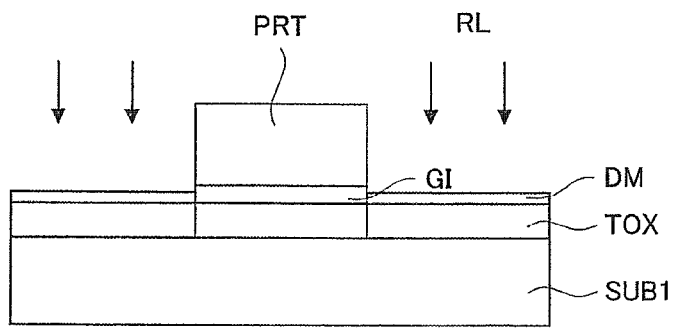
FIG. 6B is a view showing another embodiment in which a region with a high carrier concentration is selectively formed in a transparent oxide layer formed on an upper surface of a substrate.

FIG. 6B shows another embodiment in which the region with a high carrier concentration is formed in the transparent oxide layer TOX by the diffusion of the dopant material DM, and this case is different from the case of FIG. 6A in that the irradiation (or thermal annealing) of the laser light RL is performed while leaving the insulating film GI selectively formed on the surface of the transparent oxide layer TOX and the photoresist film PRT formed on the upper surface of the insulating film GI and used for selectively forming the insulating film GI.

Figure 6C:
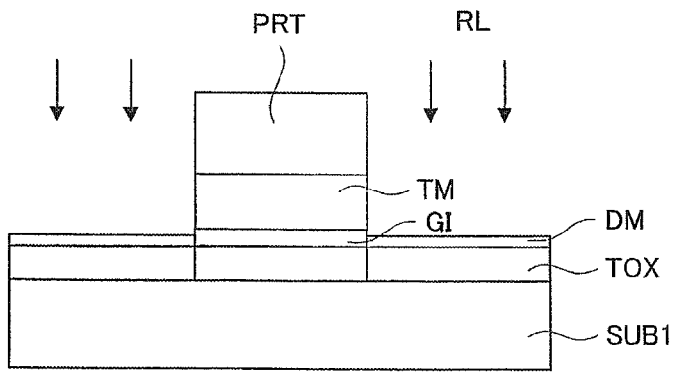
FIG. 6C is a view showing another embodiment in which a region with a high carrier concentration is selectively formed in a transparent oxide layer formed on an upper surface of a substrate.

FIG. 6C shows another embodiment in which the region with a high carrier concentration is formed in the transparent oxide layer TOX by the diffusion of the dopant material DM, and this case is different from the case of FIG. 6B in that the irradiation (or thermal annealing) of the laser light RL is performed while leaving the stacked body of the insulating film GI and the electrode TM selectively formed on the surface of the transparent oxide layer TOX and the photoresist film PRT formed on the upper surface of the stacked body and used for forming the electrode TM and the insulating film GI.

Figure 6D:
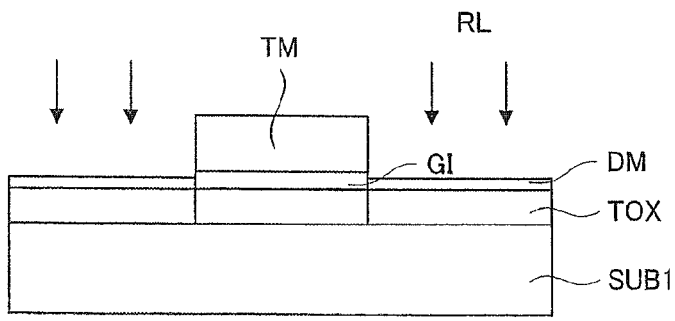
FIG. 6D is a view showing another embodiment in which a region with a high carrier concentration is selectively formed in a transparent oxide layer formed on an upper surface of a substrate.

FIG. 6D shows another embodiment in which the region with a high carrier concentration is formed in the transparent oxide layer TOX by the diffusion of the dopant material DM, and this case is different from the case of FIG. 6C in that the irradiation (or thermal annealing) of the laser light RL is performed in a state where the photoresist film PRT used for forming a stacked body of the insulating film GI and the electrode TM selectively formed on the surface of the transparent oxide layer TOX is removed.

Next, the manufacturing method of the liquid crystal display device will be described. When the region with a high carrier concentration and the region with a low carrier concentration are selectively and separately formed in the transparent oxide layer in the manufacturing process, any of the processes shown in FIG. 3 to FIG. 6 can be adopted. In the following description, for example, the method using the irradiation of the laser light is taken as an example.

Figure 7:
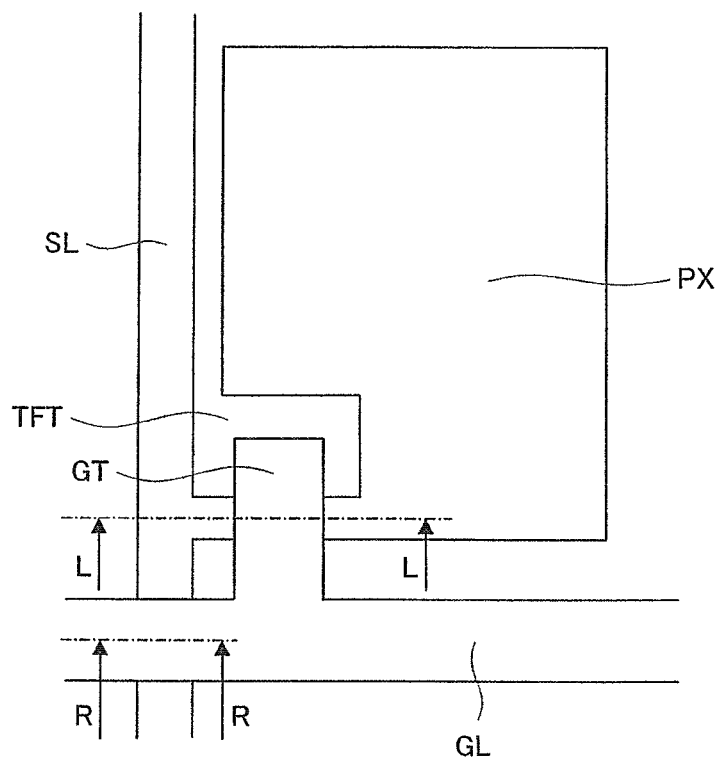
FIG. 7 is a plan view of a pixel showing positions of cross sections in process drawings shown in FIG. 8A to FIG. 8G.

FIG. 8A to FIG. 8G are process drawings showing an embodiment of the manufacturing method of the liquid crystal display device. Here, FIG. 8A to FIG. 8G are process drawings in one pixel of the liquid crystal display region, and the process drawings on the left side of FIG. 8A to FIG. 8G correspond to the cross sections of the line L-L in FIG. 7, and the process drawings on the right side of FIG. 8A to FIG. 8G correspond to the cross sections of the line R-R in FIG. 7. Further, the pixel shown in FIG. 7 is the same pixel as that shown in FIG. 2.

In addition, in the process below, the case where an LDD region portion is formed on each of a source region portion ST side and a drain region portion DT side of the channel region portion CH of the thin film transistor TFT is also described. Here, the LDD region portion functions to buffer the electric field with the gate electrode GT.

The processes will be described below in sequence.

Process 1

As shown in FIG. 8A, the substrate SUB1 made of, for example, glass is prepared, and a first transparent oxide layer TOX1 with a high resistance made of, for example, ZnO or the like and a first insulating film GI1 made of, for example, $SiO_2$ or the like are sequentially deposited on the surface (surface on the liquid crystal side) of the substrate SUB1. Here, the first insulating film GI1 functions as a gate insulating film in the forming region of the thin film transistor TFT.

Process 2

As shown in FIG. 8B, a first photoresist film PRT1 is formed on the entire upper surface of the first insulating film GI1, and the first photoresist film PRT1 is formed into a predetermined pattern.

Here, the patterned first photoresist film PRT1 is formed in the region where the source signal line SL, the thin film transistor TFT connected to the source signal line SL, and the pixel electrode PX connected to the thin film transistor TFT in the pixel shown in FIG. 7 are to be formed, and further, the patterned first photoresist film PRT1 is formed so as to have regions with different heights such as a higher region and a lower region. More specifically, the higher region is disposed on the forming region of the channel region portion of the thin film transistor TFT and the so-called LDD regions (field buffer region) on both sides of the channel region portion, and the lower region is disposed on the portion other than the forming region.

The first photoresist film PRT1 having the higher region and the lower region is formed by, for example, exposing the first photoresist film PRT1 to light by using three types of photomasks each having different translucency such as a light-shielding mask, a so-called semi-translucent mask, and a translucent mask. The first photoresist film PRT1 as described above can be formed by the exposure using a so-called half-tone mask or a gray-tone mask.

Then, with using the first photoresist film PRT1 thus formed as a mask, the first insulating film GI1 and the first transparent oxide layer TOX1 below the first insulating film GI1 exposed from the mask are sequentially etched, and the surface of the substrate SUB1 is exposed.

In this manner, the stacked body of the first transparent oxide layer TOX and the first insulating film GI1 is left on the forming regions of the source signal line SL, the thin film transistor TFT connected to the source signal line SL, and the pixel electrode PX connected to the thin film transistor TFT.

Process 3

As shown in FIG. 8C, the surface of the first photoresist film PRT1 is removed by an appropriate amount toward the bottom surface thereof. By this means, the first photoresist film PRT1 is completely removed in the forming regions of the source signal line SL, the thin film transistor TFT (except for the channel region portion and the LDD region portion thereof) connected to the source signal line SL, and the pixel electrode PX connected to the thin film transistor TFT, and is left only in the forming region of the channel region portion and the LDD region portion of the thin film transistor TFT.

Then, by irradiating, for example, the laser light RL to the first transparent oxide layer TOX1 through the first insulating film GI1, the first transparent oxide layer TOX1 is modified in terms of crystallinity. This is for the purpose of improving the carrier concentration and lowering the resistance of the first transparent oxide layer TOX1. In this case, the irradiation of the laser light RL is blocked in the portion where the first photoresist film PRT1 is formed, so that the first transparent oxide layer TOX1 directly below the first photoresist film PRT1 is allowed to maintain its high resistance.

As a result, the carrier concentration is increased in each of the forming regions of the source signal line SL, the thin film transistor TFT connected to the source signal line SL (except for the portions of the channel region portion and the LDD region portion thereof), and the pixel electrode PX connected to the thin film transistor TFT to convert the regions into electrically conductive regions, and the semiconductor region with a low carrier concentration is left in the portion of the channel region of the thin film transistor TFT.

Process 4

As shown in FIG. 8D, the first photoresist film PRT1 is all removed.

Process 5

As shown in FIG. 8E, a second insulating film GI2 made of, for example, $SiO_2$ and a second transparent oxide layer TOX2 made of, for example, ITO (Indium Tin Oxide) are sequentially deposited. Here, the second insulating film GI2 functions as an interlayer insulating film of the later-described gate signal line GL for the source signal line SL.

Process 6

As shown in FIG. 8F, a second photoresist film PRT2 is formed on the upper surface of the second transparent oxide layer TOX2, and this second photoresist film PRT2 is formed into a predetermined pattern. That is, the second photoresist film is left in each of the forming regions of the gate signal line GL and the gate electrode GT of the thin film transistor TFT connected to the gate signal line GL. Here, the forming region of the gate electrode GT is a portion directly above the channel region portion of the thin film transistor TFT, and the LDD regions on both sides of the channel region are excluded.

Thereafter, the second transparent oxide layer TOX2 exposed from the second photoresist film PRT2 is etched, and the gate signal line SL and the gate electrode T are formed from the left second transparent oxide layer TOX2.

Then, while leaving the second photoresist film PRT2 as it is, the laser light RL is irradiated to the first transparent oxide layer TOX1 through the second insulting film GI2 and the first insulating film GI1.

By the irradiation of the laser light RL, the carrier concentration is increased in the LDD regions LD on both sides of the channel region portion CH of the thin film transistor TFT. In this case, since the carrier concentration is further increased also in the portion of the first transparent oxide layer TOX1 where the carrier concentration has been increased in the process 3, the LDD region LD is formed as a region with a relatively small conductivity.

Process 7

As shown in FIG. 8G, the second photoresist film PRT2 is all removed. Thereafter, an alignment film (not shown) is formed over the surface of the substrate SUB1, thereby completing the process.

As described above, the liquid crystal display region on the surface on the liquid crystal side of the substrate SUB1 can be fabricated by the so-called two-photo process using the first photoresist film PRT1 and the second photoresist film PRT2.

Also, the first photoresist film PRT1 functions as a mask at the time of the sequential selective etching for forming the stacked body of the first transparent oxide layer TOX1 and the first insulating film GI1 and also as a mask at the time of selectively forming the region with a high carrier concentration in the first transparent oxide layer TOX1, respectively.

However, the application of the photolithography technique is required only once, and therefore, the number of processes can be reduced significantly.

FIG. 9A to FIG. 9G are process drawings showing another embodiment of the manufacturing method of the liquid crystal display device. FIG. 9A to FIG. 9G correspond to FIG. 8A to FIG. 8G, and consequently, the process drawings on the left side of FIG. 9A to FIG. 9G correspond to the cross sections of the line L-L in FIG. 7, and the process drawings on the right side of FIG. 9A to FIG. 9G correspond to the cross sections of the line R-R in FIG. 7.

The processes will be described below in sequence.

Process 1

Figure 9A:
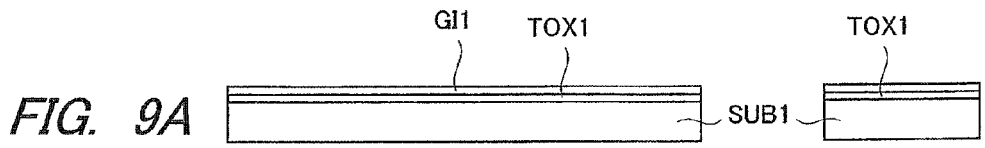
FIG. 9A is a process drawing showing another embodiment of a manufacturing method of a liquid crystal display device having the pixel shown in FIG. 7.

As shown in FIG. 9A, the substrate SUB1 is prepared, and a first transparent oxide layer TOX1 with a high resistance made of, for example, ZnO or the like and a first insulating film GI1 made of, for example, $SiO_2$ or the like are sequentially deposited on the surface of the substrate SUB1 (surface on the liquid crystal side).

Process 2

Figure 9B:
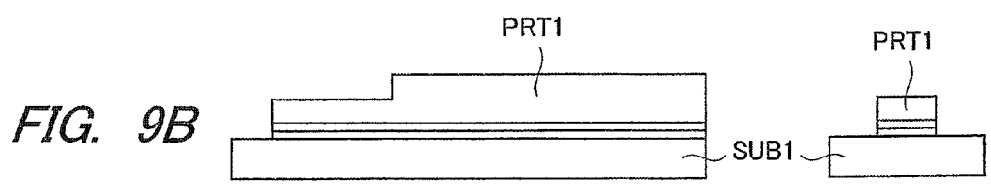
FIG. 9B is a process drawing showing another embodiment of a manufacturing method of a liquid crystal display device having the pixel shown in FIG. 7.

As shown in FIG. 9B, a first photoresist film PRT1 is formed on the entire upper surface of the first insulating film GI1, and the first photoresist film PRT1 is formed into a predetermined pattern.

Here, the patterned first photoresist film PRT1 is formed in each of the forming regions of the source signal line SL, the thin film transistor TFT connected to the source signal line SL, and the pixel electrode PX connected to the thin film transistor TFT in the pixel shown in FIG. 7, and further, the patterned first photoresist film PRT1 is formed so as to have regions with different heights such as a higher region and a lower region. More specifically, the lower region is disposed on the portion of the source signal line SL and the higher region is disposed on the portion other than the portion.

Then, with using the first photoresist film PRT1 as a mask, the first insulating film GI1 and the first transparent oxide layer TOX1 below the first insulating film GI1 exposed from the mask are sequentially etched, and the surface of the substrate SUB1 is exposed.

In this manner, the stacked body of the first transparent oxide layer TOX1 and the first insulating film GI1 is left in the forming regions of the source signal line SL, the thin film transistor TFT connected to the source signal line SL, and the pixel electrode PX connected to the thin film transistor TFT.

Process 3

Figure 9C:
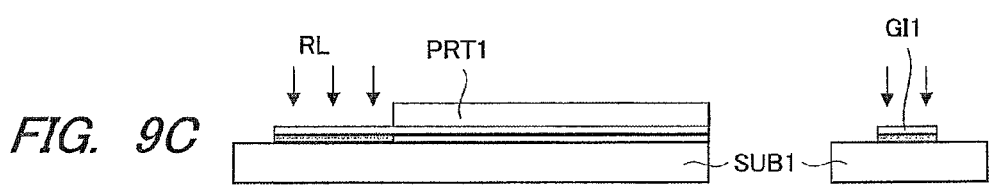
FIG. 9C is a process drawing showing another embodiment of a manufacturing method of a liquid crystal display device having the pixel shown in FIG. 7.

As shown in FIG. 9C, the surface of the first photoresist film PRT1 is removed by an appropriate amount toward the bottom surface thereof. By this means, the first photoresist film PRT1 is completely removed in the forming region of the source signal line SL, and is left in only each of the forming regions of the channel region portion of the thin film transistor TFT, the LDD region portion adjacent to the channel region portion and disposed on the source signal line SL side, and the pixel electrode PX.

Then, by irradiating the laser light RL to the first transparent oxide layer TOX1 through the first insulating film GI1, the first transparent oxide layer TOX1 is modified in terms of crystallinity. In this case, the irradiation of the laser light RL is blocked in the portion where the first photoresist film PRT1 is formed, so that the first transparent oxide layer TOX1 directly below the first photoresist film PRT1 is allowed to maintain its high resistance.

Process 4

Figure 9D:
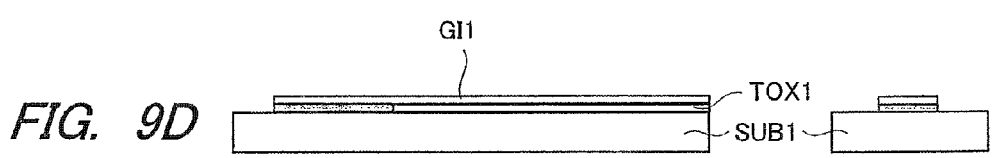
FIG. 9D is a process drawing showing another embodiment of a manufacturing method of a liquid crystal display device having the pixel shown in FIG. 7.

As shown in FIG. 9D, the first photoresist film PRT1 is all removed.

Process 5

Figure 9E:
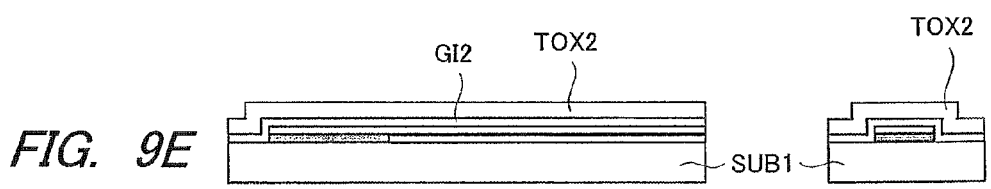
FIG. 9E is a process drawing showing another embodiment of a manufacturing method of a liquid crystal display device having the pixel shown in FIG. 7.

As shown in FIG. 9E, a second insulating film GI2 made of, for example, $SiO_2$ and a second transparent oxide layer TOX2 made of, for example, ITO (Indium Tin Oxide) are sequentially deposited.

Process 6

Figure 9F:
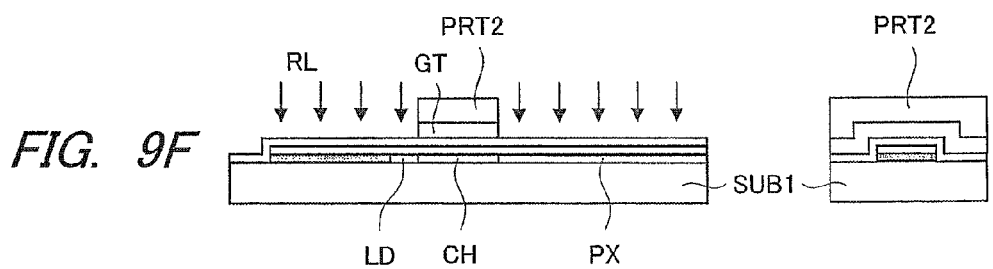
FIG. 9F is a process drawing showing another embodiment of a manufacturing method of a liquid crystal display device having the pixel shown in FIG. 7.
Figure 9G:
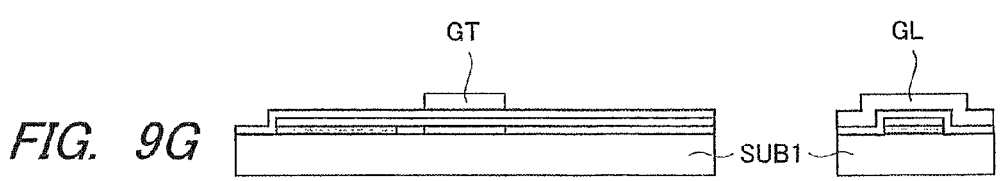
FIG. 9G is a process drawing showing another embodiment of a manufacturing method of a liquid crystal display device having the pixel shown in FIG. 7.

As shown in FIG. 9F, the second photoresist film PRT2 is formed on the upper surface of the second transparent oxide layer TOX2, and this second photoresist film PRT2 is formed into a predetermined pattern. That is, the second photoresist film is left in each of the forming regions of the gate signal line GL and the gate electrode GT of the thin film transistor TFT connected to the gate signal line GL. Here, the forming region of the gate electrode GT is a portion directly above the channel region portion of the thin film transistor TFT, and the LDD region LD on the source signal line SL side adjacent to the channel region portion is excluded.

Thereafter, the second transparent oxide layer TOX2 exposed from the second photoresist film PRT2 is etched, and the gate signal line SL and the gate electrode GT are formed from the left second transparent oxide layer TOX2.

Then, the second photoresist film PRT2 is left as it is, and the laser light RL is irradiated to the first transparent oxide layer TOX1 through the second insulting film GI2 and the first insulating film GI1.

By the irradiation of the laser light RL, the carrier concentration is increased in the LDD region LD adjacent to the channel region portion of the thin film transistor TFT. In this case, since the carrier concentration is further increased also in the portion of the first transparent oxide layer TOX1 where the carrier concentration has been increased in the process 3, the LDD region LD is formed as a region with a relatively small conductivity.

Further, similar to the forming region of the LDD region LD on the source signal line SL side, the portion of the pixel electrode PX adjacent to the channel region portion of the thin film transistor TFT is formed as a region with a relatively small conductivity. This is because, since the pixel electrode PX functions as an electrode generating an electric field with another electrode (not shown) (counter electrode), the conductivity of the pixel electrode PX can be set to a relatively small value. Further, although the first transparent oxide layer TOX1 such as ZnO is metallized and is no longer transparent when the carrier concentration is much increased, the carrier concentration of the pixel electrode PX can be controlled to an extent capable of maintaining its transparency.

In the manufacturing methods shown in FIG. 8 and FIG. 9, the method by the irradiation of the laser light RL is used when a region with a high carrier concentration is formed in the first transparent oxide layer TOX1 as an embodiment. However, the methods shown in FIG. 3 to FIG. 6 or other methods can be used as described above.

Further, a method where the irradiation of the laser light RL is performed in a state where the insulating film GI is not formed on the surface of the transparent oxide layer TOX is included in the methods shown in FIG. 3 to FIG. 6. Therefore, in the manufacturing methods shown in FIG. 8 and FIG. 9, the process in which a region with a high carrier concentration is first formed in the transparent oxide layer TOX in a state where the insulating film GI is not formed, and then the insulating film GI is formed can also be applied.

Further, after the processes shown in FIG. 8 and FIG. 9, in order to make an electrical contact with the source signal line at an array end, a photoresist film is directly drawn or evaporated using a mask in the region other than the array end region required for the contact, and the insulating film of the corresponding array end portion is etched and removed. By this means, the manufacture can be achieved without increasing the number of photo processes.

Second Embodiment

Figure 10A:
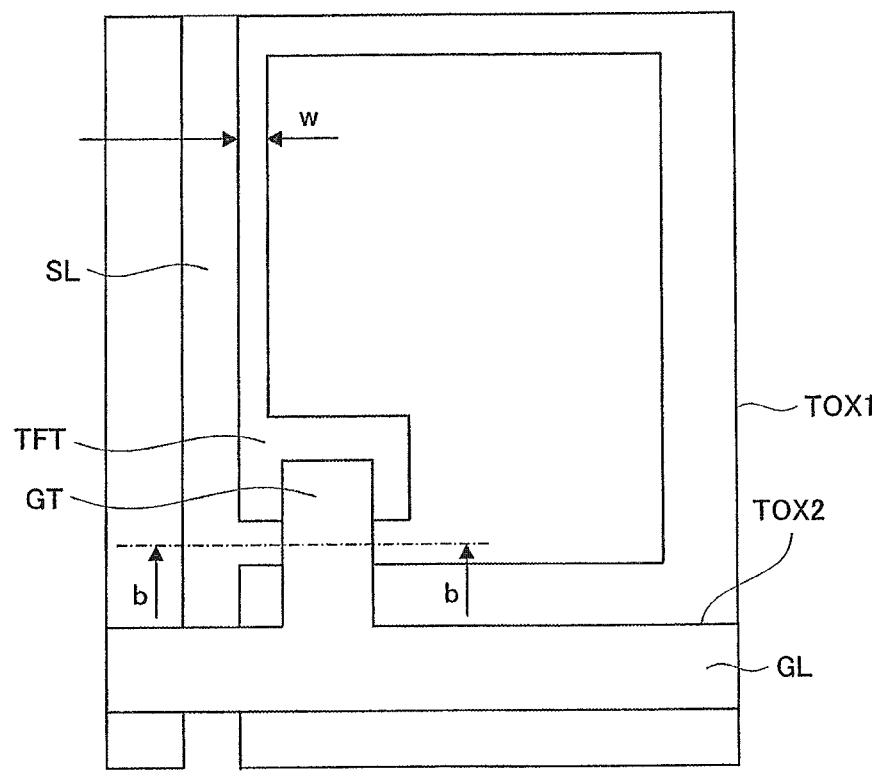
FIG. 10A is a plan view showing another embodiment of the configuration of a pixel of the display device according to the present invention.

FIG. 10A is a plan view showing another embodiment of the configuration of a pixel of a display device according to the present invention, and FIG. 10A corresponds to FIG. 2A.

In FIG. 10A, a source signal line SL, a thin film transistor TFT connected to the source signal line SL, and a pixel electrode PX connected to the thin film transistor TFT are formed in each region separately formed on the surface of a first transparent oxide layer TOX1, which is formed across the entire surface of a substrate SUB1.

The configuration of FIG. 10A is different from that of FIG. 2A in that a first transparent oxide layer TOX1 with a low carrier concentration (effectively functions as an insulator) is formed on the surface of the substrate SUB1 even in the region other than the forming regions of the source signal line SL, the thin film transistor TFT, and the pixel electrode PX. More specifically, in this configuration, the first transparent oxide layer TOX1 formed in the entire region of the surface of the substrate SUB1 is not selectively etched.

Even in such a case, since the source signal line SL and the pixel electrode PX are formed integrally in the same layer from the first transparent oxide layer TOX1, the interval therebetween (shown by w in FIG. 10A) can be reduced to the minimum, and a configuration capable of achieving the improvement of the aperture ratio of the pixel can be realized.

The first transparent oxide layer TOX1 thus configured can be formed by forming a photoresist film as usual at the time of forming the first photoresist film PRT1 in the manufacturing method shown in FIG. 8A to FIG. 8G or FIG. 9A to FIG. 9G in the first embodiment, and it is not necessary to form, for example, the half-exposed photoresist film having a difference in level on its surface.

Figure 10B:
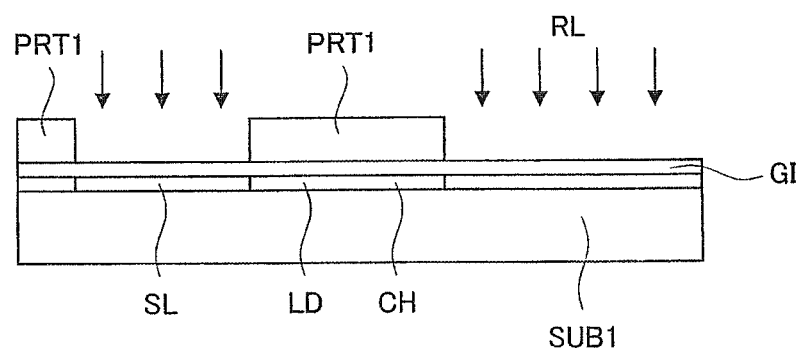
FIG. 10B is a cross-sectional view taken along the line b-b in FIG. 10A.

More specifically, as shown in FIG. 10B corresponding to the process shown in FIG. 8C and showing the process in the section of the line b-b in FIG. 10A, a photoresist film covering the channel region portion CH of the thin film transistor TFT and the LDD region portions LD on both sides of the channel region portion CH and a photoresist film covering a region other than the forming regions of the source signal line SL, the thin film transistor TFT, and the pixel electrode PX are formed from the first photoresist film PRT1, and thereafter, the process shown in FIG. 8 is to be performed. The same is true of the case where the manufacturing method shown in FIG. 9 is adapted.

The display device having the configuration as described above can achieve the advantage that the difference in level on the surface facing the liquid crystal can be reduced.

Third Embodiment

Figure 11A:
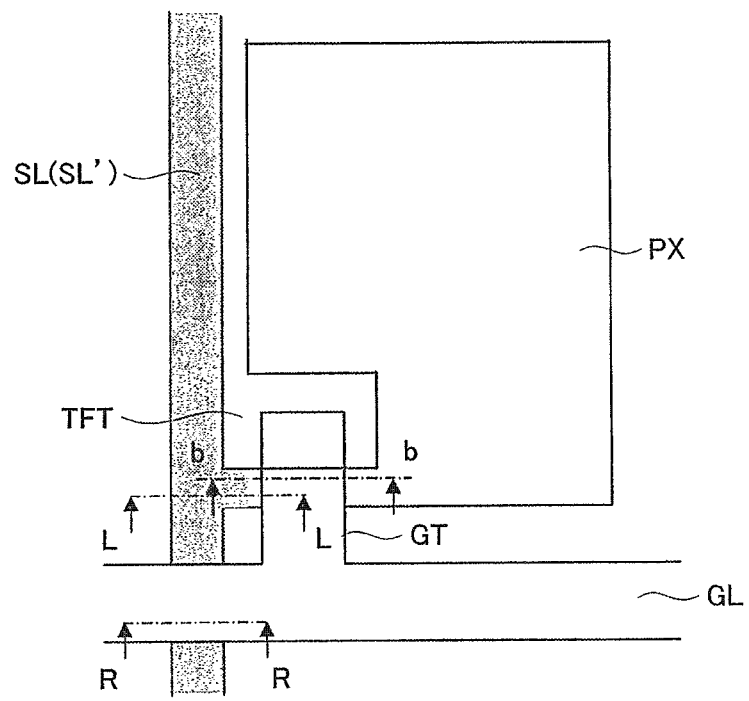
FIG. 11A is a plan view showing another embodiment of the configuration of a pixel of the display device according to the present invention.
Figure 11B:
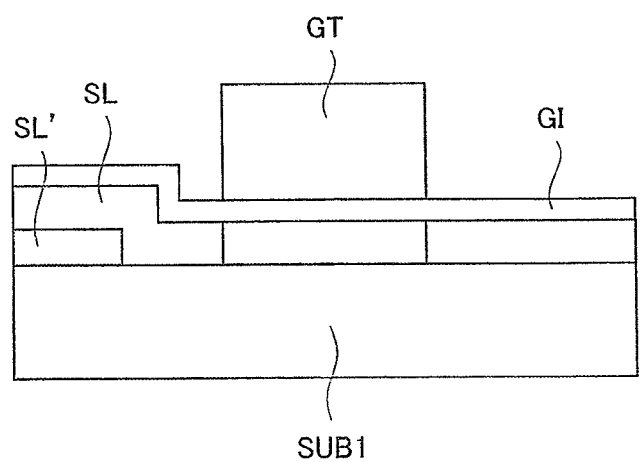
FIG. 11B is a cross-sectional view taken along the line b-b in FIG. 11A.

FIG. 11A is a plan view showing another embodiment of the configuration of a pixel of a display device according to the present invention, and FIG. 11A corresponds to FIG. 7 and FIG. 10A. Also, FIG. 11B is a cross-sectional view taken along the line b-b in FIG. 11A.

The configuration of FIG. 11A is different from those of FIG. 7 and FIG. 10A in that a main source signal line SL' is made of, for example, a metal layer with a low electric resistance and is formed independently from other members.

Here, the reason why the source signal line SL' is referred to as "main" line is that a source signal line SL made from a first transparent oxide layer TOX1 stacked across the entire region is formed for the source signal line SL'.

More specifically, the configuration shown in FIG. 7 or 10A is stacked over the surface of the substrate SUB1 on which the source signal line SL' is formed, so that the source signal line SL shown in FIG. 7 or FIG. 10A is overlapped and formed on the source signal line SL'.

Compared with the configurations of FIG. 7 and FIG. 10A, since the source signal line SL constituted of the first transparent oxide layer TOX1 is formed so as to be connected to the source signal line SL' made of a metal layer formed below the source signal line SL, the electric resistance can be significantly reduced.

In this case, FIG. 11 shows that the source signal line SL constituted of the first transparent oxide layer TOX1 and the source signal line SL' constituted of a metal layer have the center axes matched with each other and approximately the same widths. However, the source signal line SL' constituted of a metal layer can be configured to have the width smaller than the width of the source signal line SL constituted of the first transparent oxide layer TOX1. This is because the electric resistance of the source signal line can be sufficiently reduced as a whole.

Figure 12A:
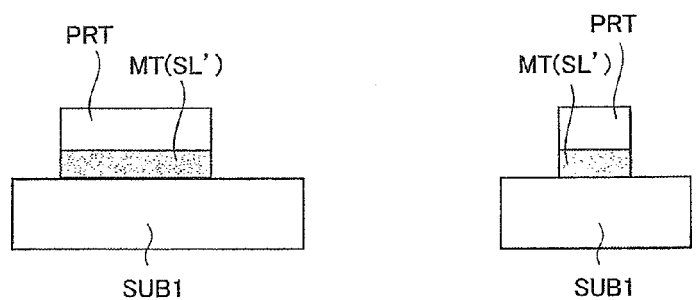
FIG. 12A is a process drawing showing an embodiment of a manufacturing method of a source signal line constituted of a metal layer shown in FIG. 11A and FIG. 11B.
Figure 12B:
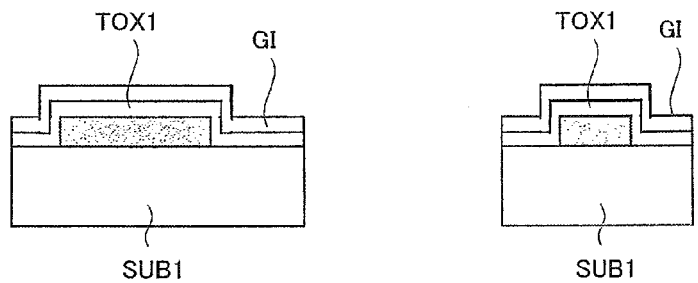
FIG. 12B is a process drawing showing an embodiment of a manufacturing method of a source signal line constituted of a metal layer shown in FIG. 11A and FIG. 11B.

FIG. 12A and FIG. 12B are process drawings showing a process of a manufacturing method in the case where the source signal line SL' is formed on the surface of the substrate SUB1.

The process drawings on the left side of FIG. 12A and FIG. 12B are cross-sectional views taken along the line L-L in FIG. 11A, and the process drawings on the right side thereof are cross-sectional views taken along the line R-R in FIG. 11A.

As shown in FIG. 12A, a metal layer MT is formed on the entire region of the surface of the substrate SUB1, and then the metal layer MT is selectively etched with using a photoresist film PRT patterned on the surface of the metal layer MT as a mask, thereby forming the source signal line SL'.

Next, after removing the photoresist film PRT, as shown in FIG. 12B, the first transparent oxide layer TOX1 made of, for example, ZnO and the insulating film GI made of, for example, $SiO_2$ are sequentially stacked.

This process corresponds to, for example, the process shown in FIG. 8A, and thereafter, the processes shown in FIG. 8B to FIG. 8G are performed, thereby completing the configuration shown in FIG. 11A and FIG. 11B.

In the configuration of the above-described embodiment, the source signal line SL constituted of the first transparent oxide layer TOX1 is stacked across the entire region of the source signal line SL'. However, the embodiment is not limited to this, and the configuration in which the source signal line SL is stacked only on a part of the source signal line SL' is also possible. For example, the configuration may be such that the source signal line SL is stacked only on the source signal line SL' in the vicinity of the thin film transistor TFT. This is because, since the source signal line SL' is made of a metal layer, the electric resistance thereof can be sufficiently reduced by itself.

Figure 13:
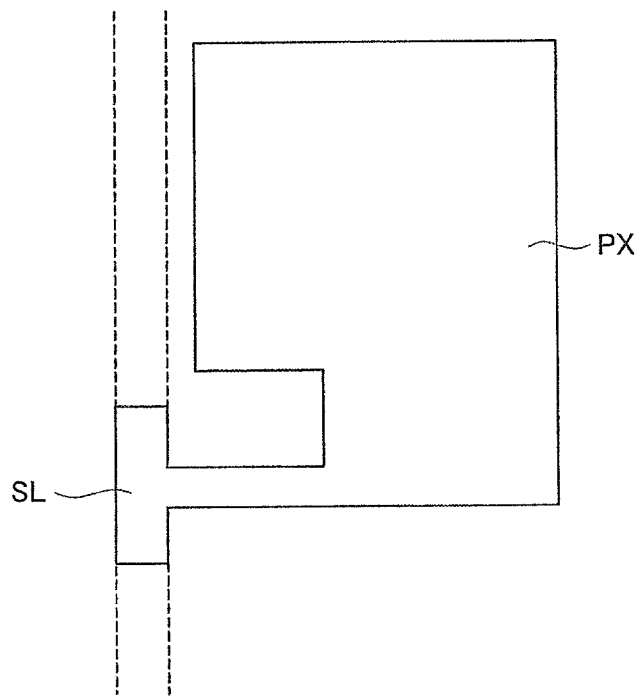
FIG. 13 is an explanatory drawing showing a modified example of the configuration of the pixel shown in FIG. 11A and FIG. 11B.

In this case, the sequential stacked body of the first transparent oxide layer TOX1 and the insulating film GI is formed to have a pattern shown in FIG. 13, and the portion formed as the source signal line SL is placed only in the vicinity of the forming region of the thin film transistor TFT.

Fourth Embodiment

Figure 14A:
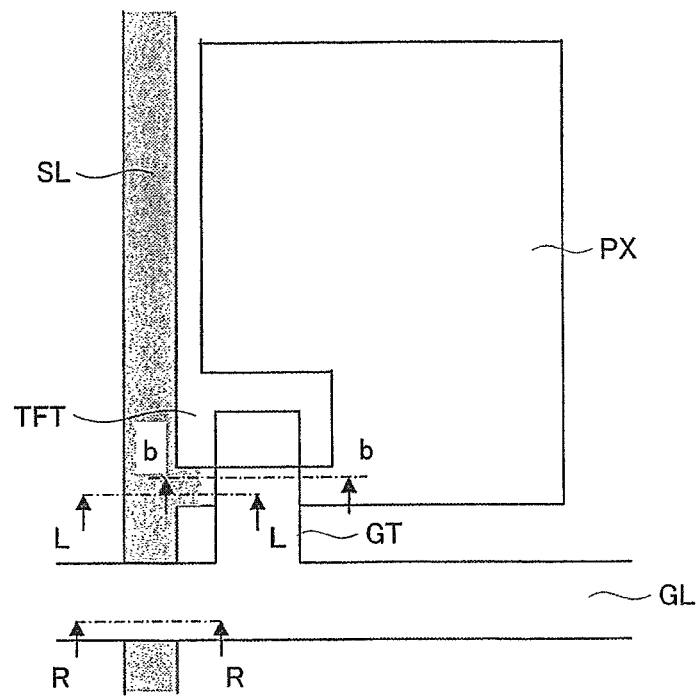
FIG. 14A is a plan view showing another embodiment of the configuration of a pixel of the display device according to the present invention.
Figure 14B:
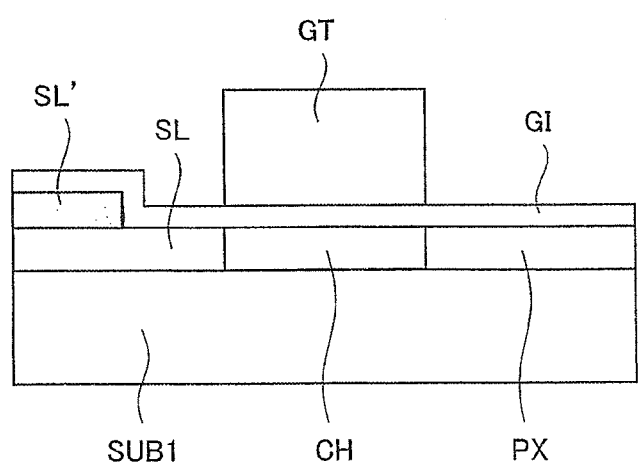
FIG. 14B is a cross-sectional view taken along the line b-b in FIG. 14A.

FIG. 14A is a plan view showing another embodiment of the configuration of a pixel of a display device according to the present invention, and FIG. 14A corresponds to FIG. 11A. FIG. 14B is a cross-sectional view taken along the line b-b in FIG. 14A.

Compared with the case of FIG. 11A, the configuration of FIG. 14A similarly has a main source signal line SL', but it is different from the configuration of FIG. 11A in that the source signal line SL' is disposed on the source signal line SL.

Also in this case, the source signal line SL' is made of, for example, a metal layer, and the source signal line SL constituted of the first transparent oxide layer TOX1 is formed and stacked on the source signal line SL', and therefore, the electric resistance can be significantly reduced.

In FIG. 14, the source signal line SL constituted of the first transparent oxide layer TOX1 and the source signal line SL' constituted of a metal layer have the center axes matched with each other and approximately the same widths. However, the source signal line SL' constituted of a metal layer can be configured to have the width smaller than the width of the source signal line SL constituted of the first transparent oxide layer TOX1. This is because the electric resistance of the source signal line can be sufficiently reduced as a whole.

FIG. 15A to FIG. 15H are process drawings showing an embodiment of the manufacturing method of the pixel of the display device, and process drawings on the left side in FIG. 15A to FIG. 15H are cross-sectional views taken along the line L-L in FIG. 14A and process drawings on the right side in FIG. 15A to FIG. 15H are cross-sectional views taken along the line R-R in FIG. 14A.

The processes will be described below in sequence.

Process 1

Figure 15A:
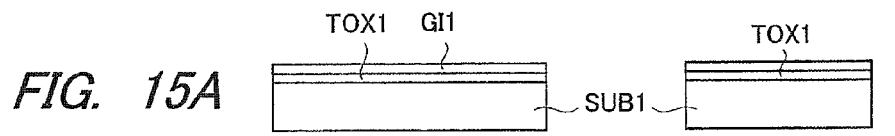
FIG. 15A is a process drawing showing an embodiment of a manufacturing method of a liquid crystal display device having the pixel shown in FIG. 14A and FIG. 14B.

As shown in FIG. 15A, the substrate SUB1 is prepared, and a first transparent oxide layer TOX1 with a high resistance made of, for example, ZnO or the like and a first insulating film GI1 made of, for example, $SiO_2$ or the like are sequentially deposited on the surface of the substrate SUB1.

Process 2

Figure 15B:
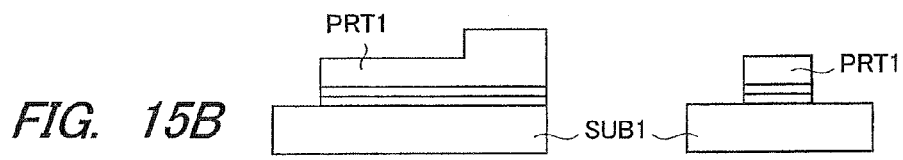
FIG. 15B is a process drawing showing an embodiment of a manufacturing method of a liquid crystal display device having the pixel shown in FIG. 14A and FIG. 14B.

As shown in FIG. 15B, the first photoresist film PRT1 is formed on the entire upper surface of the first insulating film GI1, and the first photoresist film PRT1 is formed into a predetermined pattern.

Here, the patterned first photoresist film PRT1 is formed in each of the forming regions of the source signal line SL, the thin film transistor TFT connected to the source signal line SL, and the pixel electrode PX connected to the thin film transistor TFT in the pixel shown in FIG. 14A, and further, the patterned first photoresist film PRT1 is formed so as to have regions with different heights such as a higher region and a lower region. More specifically, the higher region is disposed on the forming region of the channel region portion of the thin film transistor TFT and the so-called LDD regions on both sides of the channel region portion, and the lower region is disposed on the portion other than the forming region.

Then, with using the first photoresist film PRT1 as a mask, the first insulating film GI1 and the first transparent oxide layer TOX1 below the first insulating film GI1 exposed from the mask are sequentially etched, and the surface of the substrate SUB1 is exposed.

In this manner, the stacked body of the first transparent oxide layer TOX1 and the first insulating film GI1 is left in the forming regions of the source signal line SL, the thin film transistor TFT connected to the source signal line SL, and the pixel electrode PX connected to the thin film transistor TFT.

Process 3

Figure 15C:
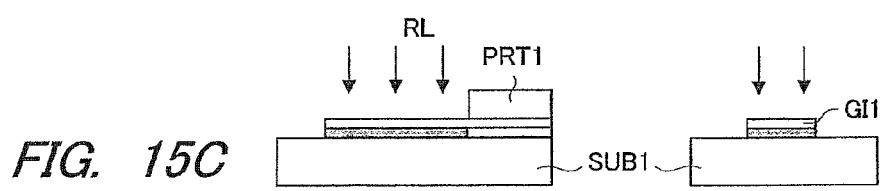
FIG. 15C is a process drawing showing an embodiment of a manufacturing method of a liquid crystal display device having the pixel shown in FIG. 14A and FIG. 14B.

As shown in FIG. 15C, the surface of the first photoresist film PRT1 is removed by an appropriate amount toward the bottom surface thereof, so that the first photoresist film PRT1 is left only in the forming region of the channel region portion of the thin film transistor TFT and the LDD region portions on both sides of the channel region portion.

Then, by irradiating the laser light RL to the first transparent oxide layer TOX1 through the first insulating film GI1, the first transparent oxide layer TOX1 is modified in terms of crystallinity and the carrier concentration thereof is improved. In this case, the irradiation of the laser light RL is blocked in the portion where the first photoresist film PRT1 is formed, so that the first transparent oxide layer TOX1 directly below the first photoresist film PRT1 is allowed to maintain its high resistance.

Process 4

Figure 15D:
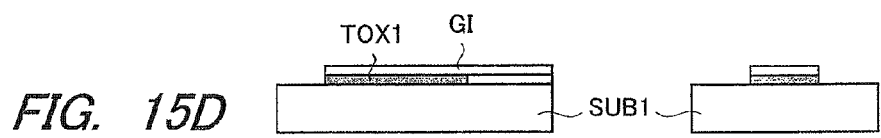
FIG. 15D is a process drawing showing an embodiment of a manufacturing method of a liquid crystal display device having the pixel shown in FIG. 14A and FIG. 14B.

As shown in FIG. 15D, the first photoresist film PRT1 is all removed.

Process 5

Figure 15E:
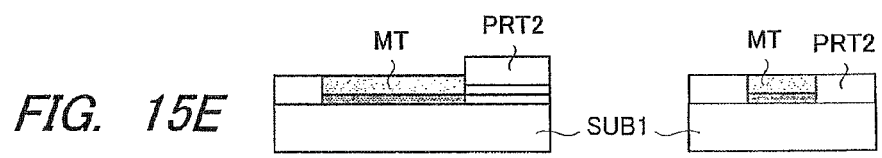
FIG. 15E is a process drawing showing an embodiment of a manufacturing method of a liquid crystal display device having the pixel shown in FIG. 14A and FIG. 14B.

As shown in FIG. 15E, a second photoresist film PRT2 is formed over the surface of the substrate SUB1, and the second photoresist film PRT2 is patterned, thereby forming the second photoresist film PRT2 removed in the portion where the source signal line SL is to be formed and left in the other portion.

Then, the first insulating film GI1 exposed from the second photoresist film PRT2 is selectively etched, and the portion (portion of the source signal line SL) of the first transparent oxide layer TOX1 modified in terms of crystallinity is exposed.

Further, while leaving the second photoresist film PTR2 as it is, a metal is evaporated from above the second photoresist film PRT2, and the second photoresist film PRT2 is peeled. This is a so-called lift off method, and a metal layer MT is formed on the portion (portion of the source signal line SL) of the first transparent oxide layer TOX1 modified in terms of crystallinity. This metal layer MT corresponds to the source signal line SL' formed and stacked on the source signal line SL.

Process 6

Figure 15F:
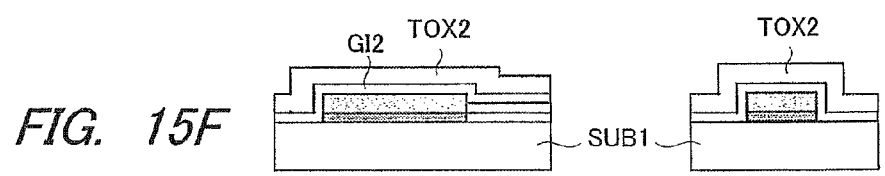
FIG. 15F is a process drawing showing an embodiment of a manufacturing method of a liquid crystal display device having the pixel shown in FIG. 14A and FIG. 14B.

As shown in FIG. 15F, the second photoresist film PRT2 is removed, and the second insulating film GI2 made of, for example, SiO$_2$ and the second transparent oxide layer TOX2 made of, for example, an ITO film are sequentially formed.

Process 7

Figure 15G:
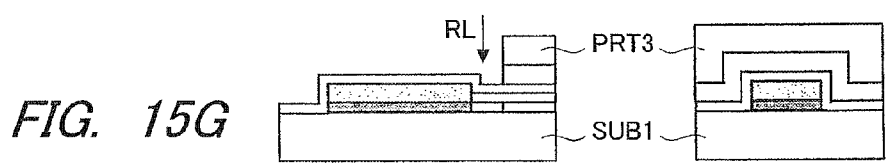
FIG. 15G is a process drawing showing an embodiment of a manufacturing method of a liquid crystal display device having the pixel shown in FIG. 14A and FIG. 14B.

As shown in FIG. 15G, a third photoresist film PRT3 is formed over the surface of the substrate SUB1, and the third photoresist film PRT3 is patterned, thereby forming the third photoresist film PRT3 left in the portion where the gate signal line GL and the gate electrode GT of the thin film transistor TFT are to be formed.

Then, with using the third photoresist film PRT3 as a mask, the second transparent oxide layer TOX2 exposed from the mask is selectively etched, and the second insulating film GI2 below the second transparent oxide layer TOX2 is exposed.

Further, while leaving the third photoresist film PRT3 as it is, the laser light RL is irradiated to the first transparent oxide layer TOX1 through the second insulting film GI2. By this means, the region between the channel region portion of the thin film transistor TFT directly below the gate electrode GT and the source signal line SL' is modified in terms of crystallinity, so that the LDD region portion LD is formed. Accordingly, in the modification in terms of crystallinity by the laser light RL in this process, it is necessary to reduce the modification level in comparison with that in the modification by the laser light RL in the process 3.

Process 8

Figure 15H:
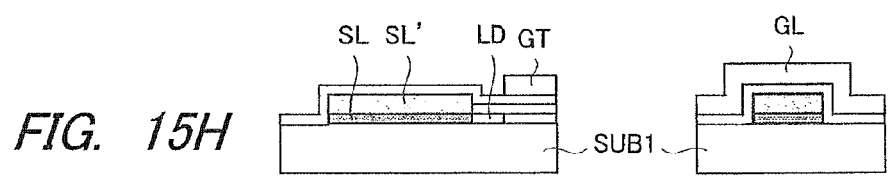
FIG. 15H is a process drawing showing an embodiment of a manufacturing method of a liquid crystal display device having the pixel shown in FIG. 14A and FIG. 14B.

As shown in FIG. 15H, the third photoresist film PRT3 is removed.

FIG. 16A to FIG. 16H are process drawings showing another embodiment of the manufacturing method of the pixel of the display device, and process drawings on the left side in FIG. 16A to FIG. 16H are cross-sectional views taken along the line L-L in FIG. 14A and process drawings on the right side in FIG. 16A to FIG. 16H are cross-sectional views taken along the line R-R in FIG. 14A.

The processes will be described below in sequence.

Process 1

Figure 16A:
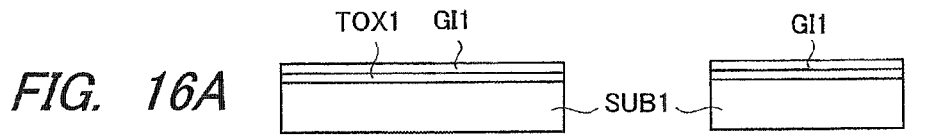
FIG. 16A is a process drawing showing another embodiment of a manufacturing method of a liquid crystal display device having the pixel shown in FIG. 14A and FIG. 14B.

As shown in FIG. 16A, the substrate SUB1 is prepared, and a first transparent oxide layer TOX1 with a high resistance made of, for example, ZnO or the like and a first insulating film GI1 made of, for example, SiO$_2$ or the like are sequentially deposited on the surface of the substrate SUB1.

Process 2

Figure 16B:
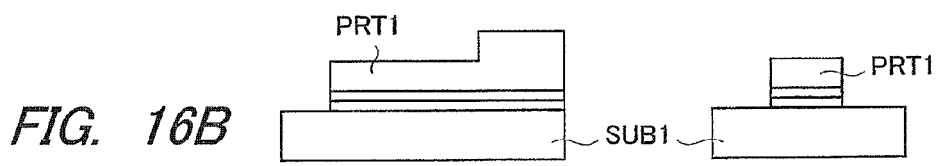
FIG. 16B is a process drawing showing another embodiment of a manufacturing method of a liquid crystal display device having the pixel shown in FIG. 14A and FIG. 14B.

As shown in FIG. 16B, the first photoresist film PRT1 is formed on the entire upper surface of the first insulating film GI1, and the first photoresist film PRT1 is formed into a predetermined pattern.

Here, the patterned first photoresist film PRT1 is formed in each of the forming regions of the source signal line SL, the thin film transistor TFT connected to the source signal line SL, and the pixel electrode PX connected to the thin film transistor TFT in the pixel shown in FIG. 14A, and further, the patterned first photoresist film PRT1 is formed so as to have regions with different heights such as a higher region and a lower region. More specifically, the higher region is disposed on the forming region of the channel region portion of the thin film transistor TFT and the forming region of the LDD regions on both sides of the channel region portion, and the lower region is disposed on the portion other than the forming regions.

Then, with using the first photoresist film PRT1 as a mask, the first insulating film GI1 and the first transparent oxide layer TOX1 below the first insulating film GI1 exposed from the mask are sequentially etched, and the surface of the substrate SUB1 is exposed.

In this manner, the stacked body of the first transparent oxide layer TOX1 and the first insulating film GI1 is left in the forming regions of the source signal line SL, the thin film transistor TFT connected to the source signal line SL, and the pixel electrode PX connected to the thin film transistor TFT.

Process 3

Figure 16C:
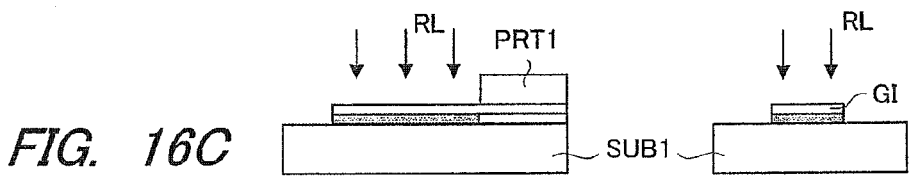
FIG. 16C is a process drawing showing another embodiment of a manufacturing method of a liquid crystal display device having the pixel shown in FIG. 14A and FIG. 14B.

As shown in FIG. 16C, the surface of the first photoresist film PRT1 is removed by an appropriate amount toward the bottom surface thereof, so that the first photoresist film PRT1 is left only in the forming region of the channel region portion of the thin film transistor TFT and the LDD region portions on both sides of the channel region portion.

Then, by irradiating the laser light RL to the first transparent oxide layer TOX1 through the first insulating film GI1, the first transparent oxide layer TOX1 is modified in terms of crystallinity and the carrier concentration thereof is improved. In this case, the irradiation of the laser light RL is blocked in the portion where the first photoresist film PRT1 is formed, so that the first transparent oxide layer TOX1 directly below the first photoresist film PRT1 is allowed to maintain its high resistance.

Thereafter, with using the first photoresist film PRT1 as a mask, the first insulating film GI1 is removed.

Process 4

Figure 16D:
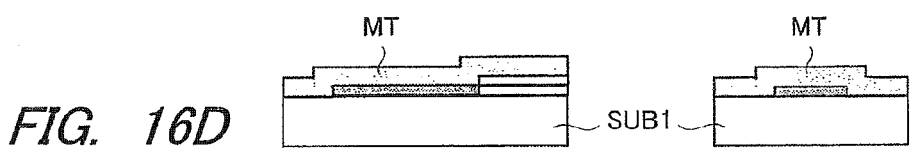
FIG. 16D is a process drawing showing another embodiment of a manufacturing method of a liquid crystal display device having the pixel shown in FIG. 14A and FIG. 14B.

As shown in FIG. 16D, metal is evaporated over the entire region of the surface of the substrate SUB1, thereby forming a metal layer MT.

Process 5

Figure 16E:
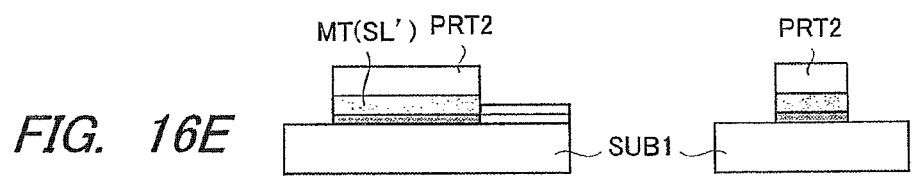
FIG. 16E is a process drawing showing another embodiment of a manufacturing method of a liquid crystal display device having the pixel shown in FIG. 14A and FIG. 14B.

As shown in FIG. 16E, a second photoresist film PRT2 is formed over the entire region of the surface of the substrate SUB1, and then the second photoresist film PRT2 is patterned, thereby leaving the second photoresist film PRT2 in the forming region of the source signal line SL.

Then, with using the second photoresist film PRT2 as a mask, the metal layer MT exposed from the mask is selectively etched.

Further, the second photoresist film PRT2 is removed, and the left metal layer MT is formed as the source signal line SL'.

Process 6

Figure 16F:
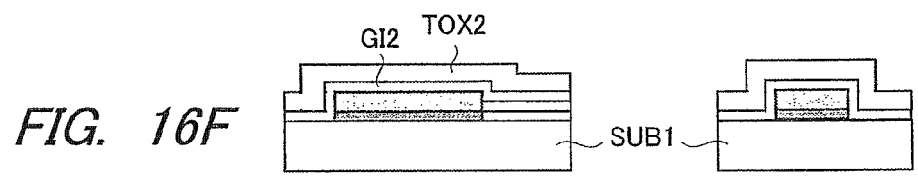
FIG. 16F is a process drawing showing another embodiment of a manufacturing method of a liquid crystal display device having the pixel shown in FIG. 14A and FIG. 14B.

As shown in FIG. 16F, for example, the second insulating film GI2 made of, for example, $SiO_2$ and the second transparent oxide layer TOX2 made of, for example, an ITO film are sequentially formed.

Process 7

Figure 16G:
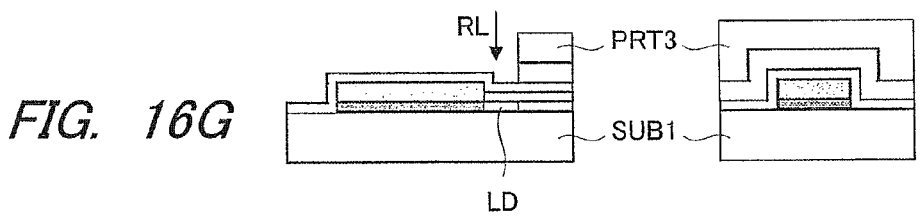
FIG. 16G is a process drawing showing another embodiment of a manufacturing method of a liquid crystal display device having the pixel shown in FIG. 14A and FIG. 14B.

As shown in FIG. 16G, a third photoresist film PRT3 is formed over the surface of the substrate SUB1, and then the third photoresist film PRT3 is patterned, thereby forming the third photoresist film PRT3 left in the portion where the gate signal line GL and the gate electrode GT of the thin film transistor TFT are to be formed.

Then, with using the third photoresist film PRT3 as a mask, the second transparent oxide layer TOX2 exposed from the mask is selectively etched, and the second insulating film GI2 below the second transparent oxide layer TOX2 is exposed.

Further, while leaving the third photoresist film PRT3 as it is, the laser light RL is irradiated to the first transparent oxide layer TOX1 through the second insulting film GI2. By this means, the region between the channel region portion of the thin film transistor TFT directly below the gate electrode GT and the source signal line SL' is modified in terms of crystallinity, so that the LDD region portion LD is formed. Accordingly, in the modification in terms of crystallinity by the laser light RL in this process, it is necessary to reduce the modification level in comparison with that in the modification by the laser light RL in the process 3.

Process 8

Figure 16H:
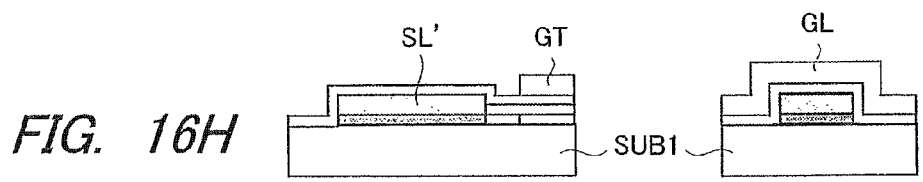
FIG. 16H is a process drawing showing another embodiment of a manufacturing method of a liquid crystal display device having the pixel shown in FIG. 14A and FIG. 14B.

As shown in FIG. 16H, the third photoresist film PRT3 is removed.

Fifth Embodiment

Figure 17A:
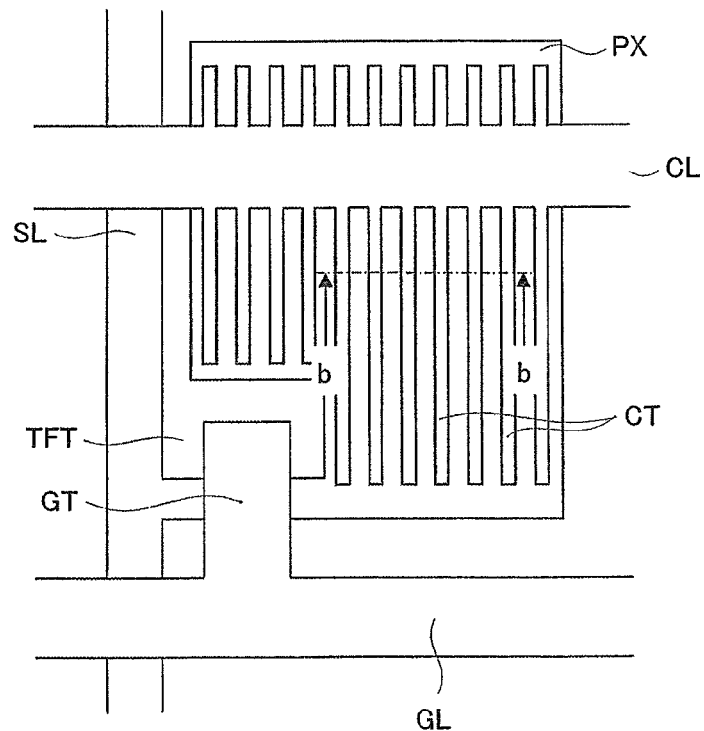
FIG. 17A is a configuration diagram showing another embodiment of the pixel of the display device according to the present invention.
Figure 17B:
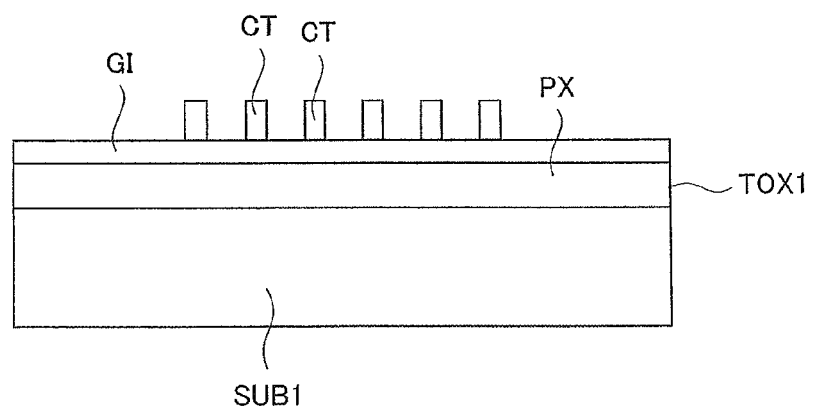
FIG. 17B is a cross-sectional view taken along the line b-b in FIG. 17A.

FIG. 17A is a plan view showing another embodiment of the configuration of a pixel of a display device according to the present invention. FIG. 17B is a cross-sectional view taken along the line b-b in FIG. 17A.

The pixel shown in FIG. 17 is configured to have a pixel electrode PX and a counter electrode CT which generates an electric field with the pixel electrode PX in a pixel region on a liquid crystal side of a substrate SUB 1.

The pixel electrode PX is configured to be supplied with a video signal from a source signal line SL via a thin film transistor TFT, and has the approximately same configuration as that described in the embodiments above.

The counter electrode CT is disposed and overlapped on the pixel electrode PX via an insulating film (for example, first insulating film), and is configured as a comb-shaped electrode including a number of electrodes disposed in parallel.

The counter electrode CT is integrally formed with a common signal line CL, which extends approximately in parallel with the gate signal line GL, at the mid-portion of each electrode, and a reference voltage serving as a reference for the video signal is applied to the comb-shaped electrode through the common signal line CL.

The comb-shaped electrode integrally formed with the common signal line CL is in the same layer as the gate signal line GL, and for example, the comb-shaped electrode is formed at the same time of forming the gate signal line GL.

The molecules of the liquid crystal disposed for the pixel thus configured via an alignment film (not shown) are oriented by the electric field generated between the pixel electrode PX and the counter electrode CT.

Then, in the configuration of the pixel in this case, the entire region of the pixel electrode PX is modified in terms of crystallinity (or doped with impurity) to convert the region into an electrically conductive region.

In its manufacture, when the method as shown in FIG. 8A to FIG. 8G of the first embodiment is used and the modification in terms of crystallinity (or impurity doping) of the pixel electrode PX is performed at the same time of the modification in terms of crystallinity (or impurity doping) of the source signal line SL, the modification in terms of crystallinity (or impurity doping) is performed across the entire region of the pixel electrode.

Figure 18:
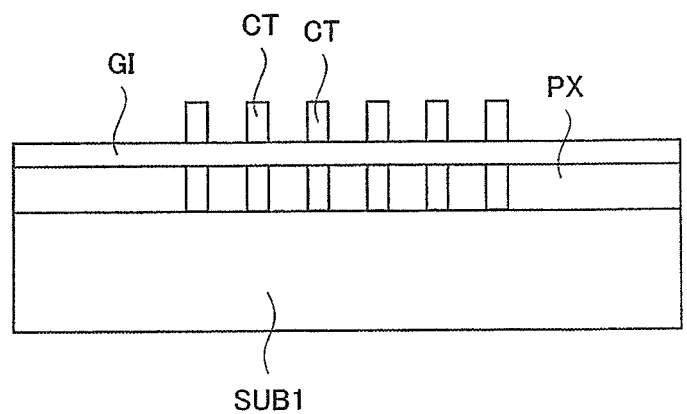
FIG. 18 is a configuration diagram showing another embodiment of the pixel of the display device according to the present invention.

However, the configuration is not limited to that described above, and the configuration may be such that the modification in terms of crystallinity is not performed in the region of the pixel electrode PX directly below the counter electrode CT as shown in FIG. 18 corresponding to FIG. 17B. In the manufacture of the pixel, for example, when the method as shown in FIG. 9A to FIG. 9G of the first embodiment is used, the counter electrode CT already formed at the time of the irradiation of the laser light RL (or impurity doping) to the pixel electrode PX serves as a mask, so that the configuration as shown in FIG. 18 can be obtained.

In this case, there arises a problem that the carrier concentration of the pixel electrode is lowered even in the region below the common signal line CL, and the potential is difficult to reach inside the pixel electrode PX, and the problem has to be solved.

Figure 19:
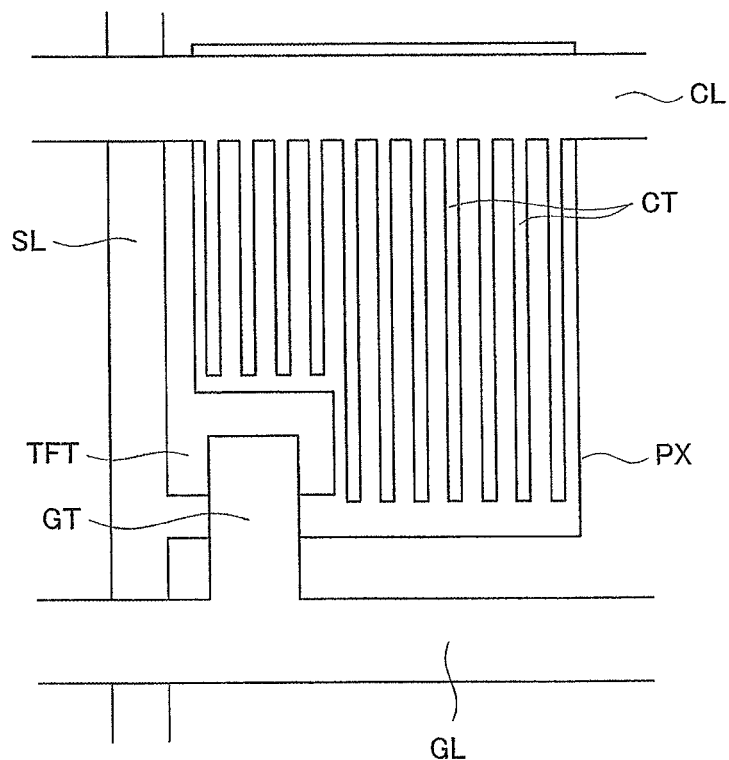
FIG. 19 is a configuration diagram showing another embodiment of the pixel of the display device according to the present invention.

In this case, as shown in FIG. 19, the common signal line CL integrally formed with the counter electrode CT is positioned on the peripheral side of the pixel region. In other words, the common signal line CL is formed as a pattern coupled to the counter electrode CT at the end portion thereof. By this means, it becomes possible to achieve an effective use of the pixel electrode PX.

Sixth Embodiment

Figure 20A:
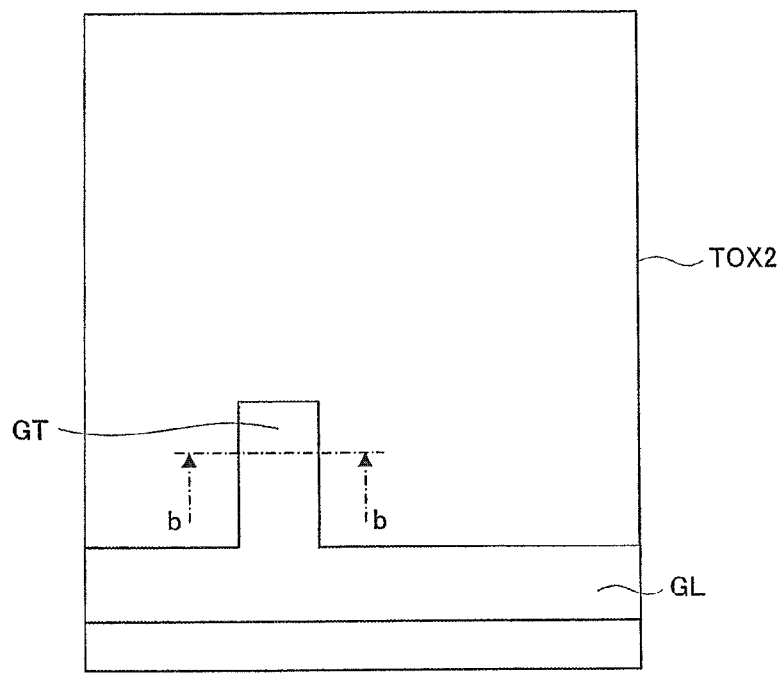
FIG. 20A is a configuration diagram showing another embodiment of the pixel of the display device according to the present invention.
Figure 20B:
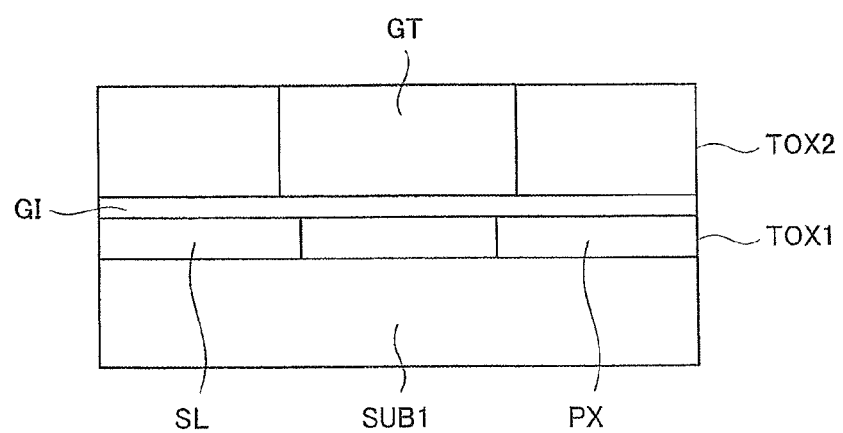
FIG. 20B is a cross-sectional view taken along the line b-b in FIG. 20A.

FIG. 20A is a plan view showing another embodiment of the configuration of a pixel of a display device according to the present invention, and FIG. 20A is a view showing that a second transparent oxide layer TOX2 formed as the upper layer of the two transparent oxide layers formed on the surface of a substrate SUB1 is formed on the entire region of the pixel region, and a gate signal line GL and a gate electrode GT are formed in a part of the second transparent oxide layer TOX2. Also, FIG. 20B is a cross-sectional view taken along the line b-b in FIG. 20A.

A first transparent oxide layer TOX1 formed as the lower layer of the two transparent oxide layers TOX1 and TOX2 formed on the surface of a substrate SUB1 is formed on the entire region of the pixel region, and a source signal line SL, a thin film transistor TFT connected to the source signal line SL, and a pixel electrode PX connected to the thin film transistor TFT are formed in a part of the first transparent oxide layer TOX1.

In this transparent oxide layer TOX1, the region other than the source signal line SL, the thin film transistor TFT and the pixel electrode PX is a region (insulating region) where modification in terms of crystallinity (or impurity doping) is not performed. Accordingly, the first transparent oxide layer TOX1 is configured to be a flat layer having no difference in level.

Also, the second transparent oxide layer TOX2 is formed on the upper surface of the first transparent oxide layer TOX1 via an insulating film GI across the entire region of the pixel region, and a gate signal line GL and a gate electrode GT connected to the gate signal line GL are formed in a part of the second transparent oxide layer TOX2. More specifically, in this second transparent oxide layer TOX2, the modification in terms of crystallinity (or impurity doping) is not performed in the region other than the gate signal line GL and the gate electrode GT, and therefore, a sufficient transparency is maintained in this region. Therefore, the second transparent oxide layer TOX2 is also configured to be a flat layer having no difference in level.

In the display device thus configured, the source signal line SL, the gate signal line GL, the thin film transistor TFT, and the pixel electrode PX can be formed from a sequential stacked body of the first transparent oxide layer TOX1, the insulating film GI, and the second transparent oxide layer TOX2 formed on the entire region of the pixel region. Therefore, the display device can be configured to have a surface having no difference in level.

Figure 21:
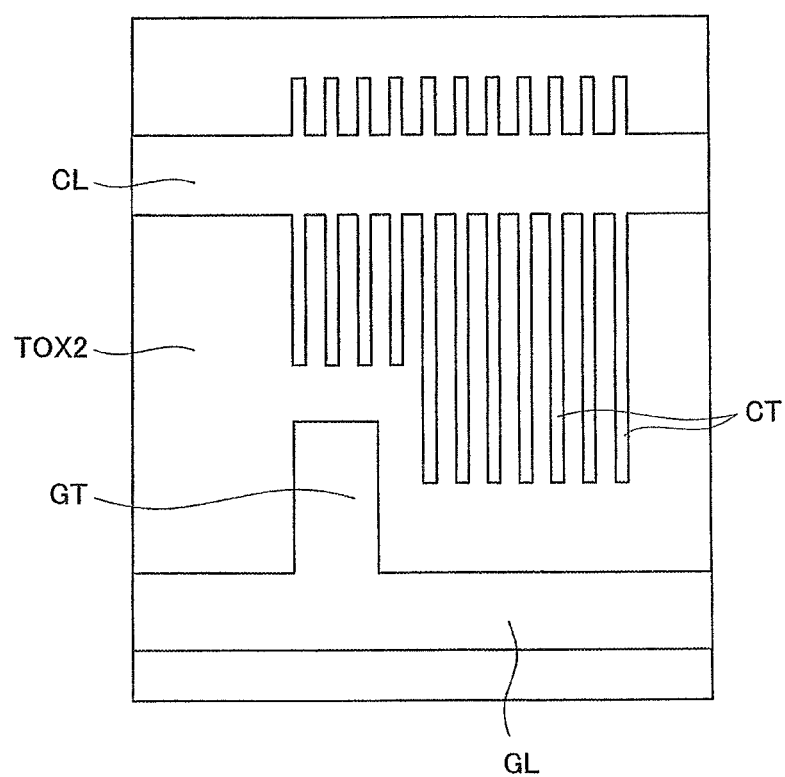
FIG. 21 is a configuration diagram showing another embodiment of the pixel of the display device according to the present invention.

Further, FIG. 21 is a plan view showing another embodiment of the configuration of a pixel of the display device according to the present invention, and FIG. 21 corresponds to FIG. 20A.

FIG. 21 shows a configuration in which the counter electrode CT and the common signal line CL connected to the counter electrode CT are provided for the substrate SUB1. The counter electrode CT and the common signal line CL are formed in a part of the second transparent oxide layer TOX2 shown in FIG. 20A.

By selectively performing the modification in terms of crystallinity (or impurity doping) to the second transparent oxide layer TOX2 formed over the surface of the substrate SUB1, the counter electrode CT and the common signal line CL are formed together with the gate signal line GL and the gate electrode GT.

Also in the display device thus configured, the difference in level on the surface of the substrate SUB1 can be avoided.

Seventh Embodiment

Figure 22:
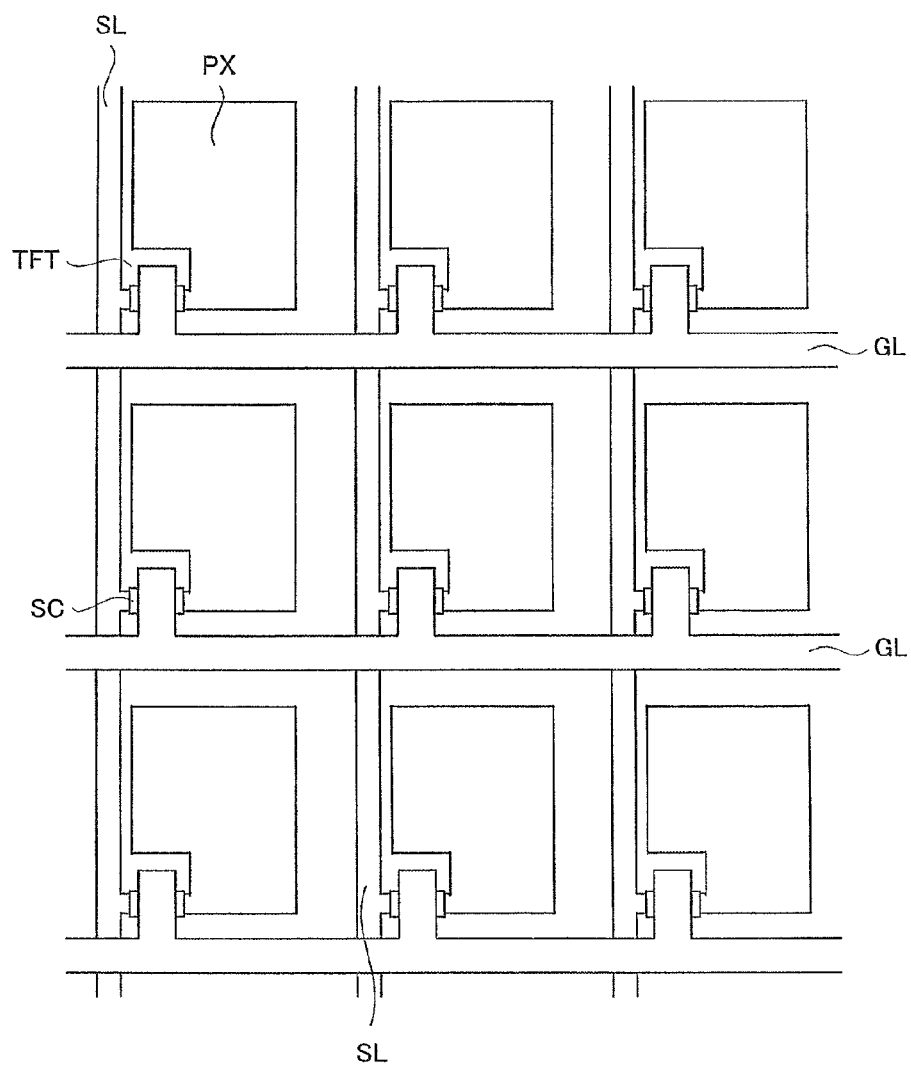
FIG. 22 is a configuration diagram showing another embodiment of a circuit formed in a liquid crystal display region of a surface on a liquid crystal side of one substrate of the substrates disposed to be opposed to each other via the liquid crystal of a liquid crystal display device.

FIG. 22 is a plan view showing an embodiment of each pixel disposed in an array on the surface of the substrate SUB1, and FIG. 22 corresponds to FIG. 1.

The configuration of FIG. 22 is different from that of FIG. 1 in the thin film transistor TFT, and a semiconductor layer SC thereof is formed so as to be protruded from both sides of the gate electrode GT. The semiconductor layer SC is formed separately from the first transparent oxide layer TOX1 constituting the source signal line SL, the pixel electrode PX and others.

Figure 23A:
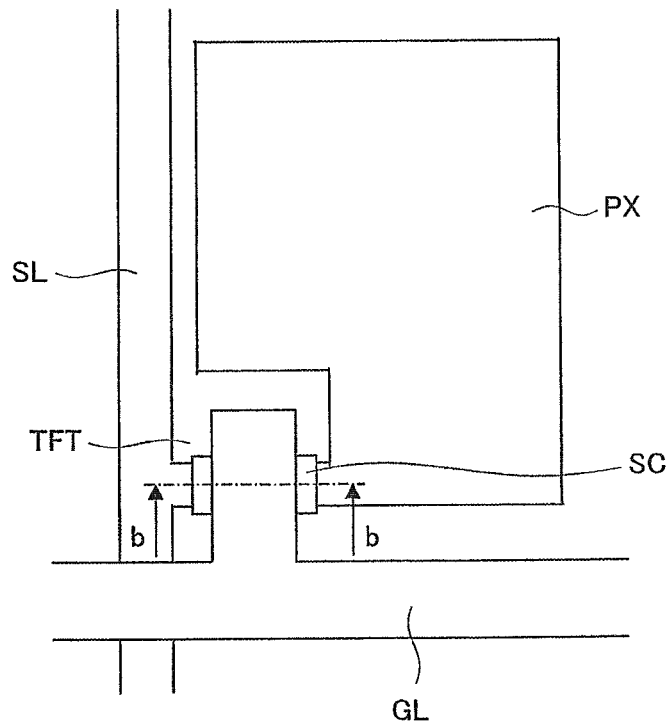
FIG. 23A is a view showing an embodiment of the configuration of one pixel extracted from the pixels shown in FIG. 22.
Figure 23B:
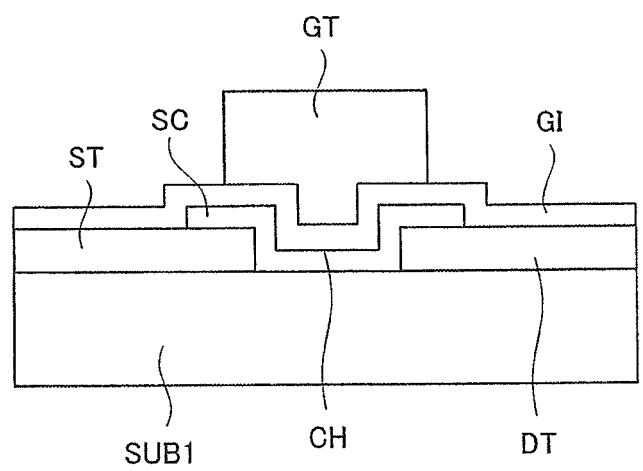
FIG. 23B is a cross-sectional view taken along the line b-b in FIG. 23A.

FIG. 23A is an enlarged view of one pixel extracted from the pixels of FIG. 22, and FIG. 23B is a cross-sectional view taken along the line b-b in FIG. 23A.

In FIG. 23B, a source region portion ST and a drain region portion DT of the thin film transistor TFT are physically separated and disposed on the surface of the substrate SUB1.

The source region portion ST is formed as an extended portion of the source signal line SL and the drain region portion DT is formed as an extended portion of the pixel electrode PX, and both of them are formed from, for example, the first transparent oxide layer TOX1 constituted of a transparent oxide film made of ZnO, ITO or the like doped with an impurity.

In other words, the first transparent oxide layer TOX1 is formed in each of the forming regions of a source signal line SL, a source region portion ST of the thin film transistor TFT serving as the extended portion of the source signal line SL, a pixel electrode PX, and a drain region portion of the thin film transistor TFT serving as the extended portion of the pixel electrode PX, and moreover, it is configured to have a pattern with a notched portion formed in the channel region portion of the thin film transistor TFT.

Further, the semiconductor layer SC is disposed between the source region portion ST and the drain region portion DT so as to be overlapped on the source region portion ST at one end and overlapped on the drain region portion DT at the other end. The semiconductor layer SC between the source region portion ST and the drain region portion DT functions as a channel region portion CH of the thin film transistor TFT.

An insulating film GI is formed over the surface of the substrate SUB1 so as to cover the source signal line SL, the source region portion ST, the semiconductor layer SC, the drain region portion DT, the pixel electrode PX and others, and the gate electrode GT is formed on the upper surface of this insulating film GI so as to be overlapped on the channel region of the semiconductor layer SC. The gate electrode GT is configured as an extended portion of the gate signal line GL.

FIG. 25A to FIG. 25H are process drawings showing an embodiment of a manufacturing method of the display device.

Figure 24:
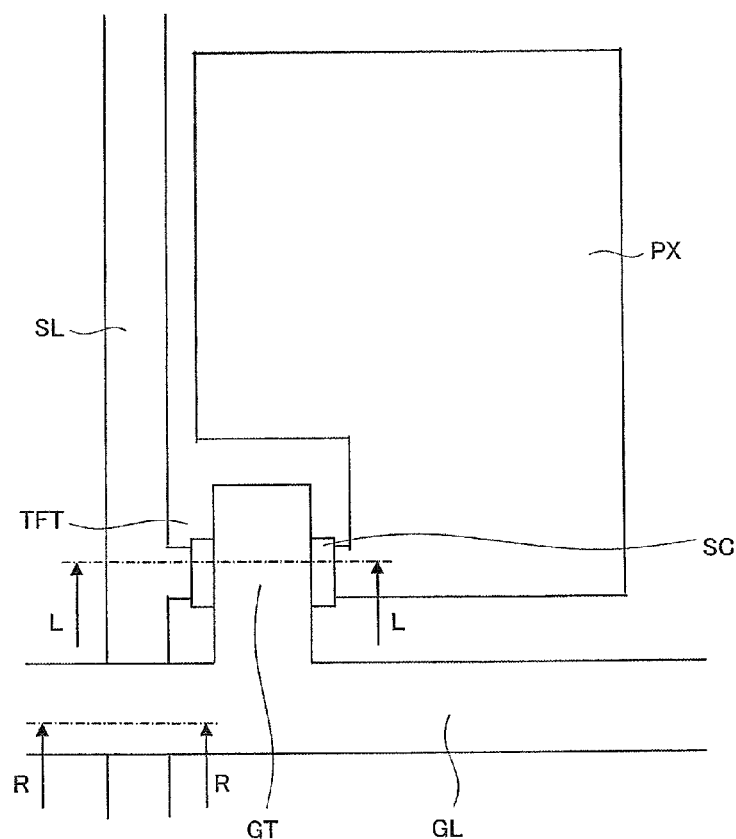
FIG. 24 is a plan view of a pixel showing positions of cross sections in process drawings shown in FIG. 25A to FIG. 25H.

Here, FIG. 25A to FIG. 25H show the process drawings in one pixel of a liquid crystal display region, and the process drawings on the left side of FIG. 25A to FIG. 25H correspond to the cross sections of the line L-L in the pixel shown in FIG. 24, and the process drawings on the right side of FIG. 25A to FIG. 25H correspond to the cross sections of the line R-R in the pixel shown in FIG. 24. The pixel shown in FIG. 24 is the same as that shown in FIG. 23A.

The processes will be described below in sequence.

Process 1

Figure 25A:
FIG. 25A is a process drawing showing an embodiment of a manufacturing method of a liquid crystal display device having the pixel shown in FIG. 24.

As shown in FIG. 25A, the substrate SUB1 is prepared, and the first transparent oxide layer TOX1 made of, for example, ZnO doped with an impurity is formed on the surface of the substrate SUB1.

Process 2

Figure 25B:
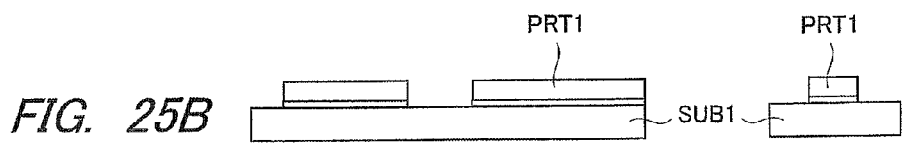
FIG. 25B is a process drawing showing an embodiment of a manufacturing method of a liquid crystal display device having the pixel shown in FIG. 24.

As shown in FIG. 25B, a first photoresist film PRT1 is formed over the surface of the substrate SUB1, and the first photoresist film PRT1 is patterned, thereby forming the first photoresist film PRT1 left in the forming regions of the source signal line SL, the source region portion ST of the thin film transistor TFT serving as an extended portion of the source signal line SL, the pixel electrode PX, and the drain region portion DT of the thin film transistor TFT serving as an extended portion of this pixel electrode PX.

Then, with using the left first photoresist film PRT1 as a mask, the first transparent oxide layer TOX1 exposed from the mask is selectively etched. By this means, the source signal line SL, the source region portion ST of the thin film transistor TFT, the pixel electrode PX, and the drain region portion DT of the thin film transistor TFT are formed.

Process 3

Figure 25C:
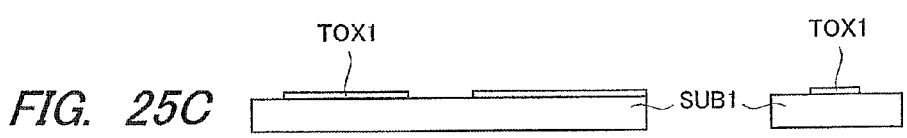
FIG. 25C is a process drawing showing an embodiment of a manufacturing method of a liquid crystal display device having the pixel shown in FIG. 24.

As shown in FIG. 25C, the first photoresist film PRT1 is removed.

Process 4

Figure 25D:
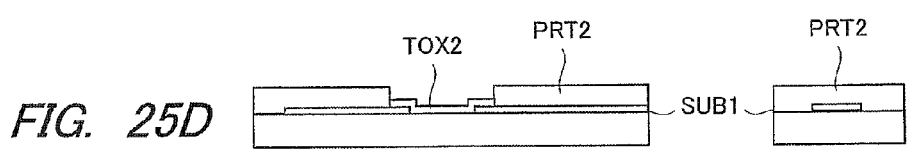
FIG. 25D is a process drawing showing an embodiment of a manufacturing method of a liquid crystal display device having the pixel shown in FIG. 24.

As shown in FIG. 25D, the second photoresist PRT2 is formed over the surface of the substrate SUB1, and the second photoresist film PRT2 is patterned, thereby forming the photoresist film PRT2 having an opening which exposes a space portion between the source region portion ST and the drain region portion DT, an end portion of the source region portion ST on the space portion side, and an end portion of the drain region portion DT on the space portion side.

Then, the second transparent oxide layer TOX2 made of, for example, ZnO doped with an intrinsic or low-concentration impurity is formed over the surface of the substrate SUB1.

Process 5

Figure 25E:
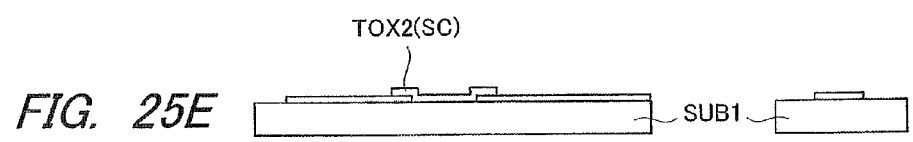
FIG. 25E is a process drawing showing an embodiment of a manufacturing method of a liquid crystal display device having the pixel shown in FIG. 24.

As shown in FIG. 25E, by removing the second photoresist film PRT2, in the space portion between the source region portion ST and the drain region portion DT, the second transparent oxide layer TOX2 disposed so as to be overlapped on the source region portion ST at one end and overlapped on the drain region portion DT at the other end is selectively formed. This is the formation by a so-called lift off method. The second transparent oxide layer TOX2 is configured as a semiconductor layer SC of the thin film transistor TFT.

Process 6

Figure 25F:
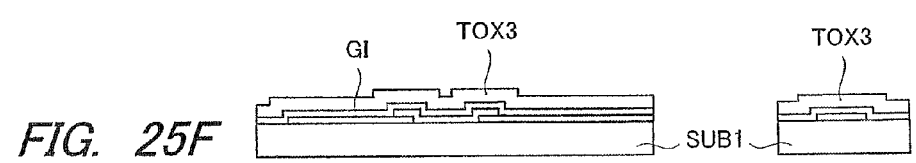
FIG. 25F is a process drawing showing an embodiment of a manufacturing method of a liquid crystal display device having the pixel shown in FIG. 24.

As shown in FIG. 25F, an insulating film GI constituted of, for example, an $SiO_2$ film and a third transparent oxide layer TOX3 constituted of, for example, an ITO film are sequentially formed over the surface of the substrate SUB1.

The insulating film GI functions as a gate insulating film of the thin film transistor TFT and an interlayer insulating film of the later-described gate signal line GL for the source signal line SL.

The gate insulating film of the thin film transistor TFT may be formed by forming an insulating film to be stacked on the semiconductor layer of the thin film transistor TFT in the process 4.

Process 7

Figure 25G:
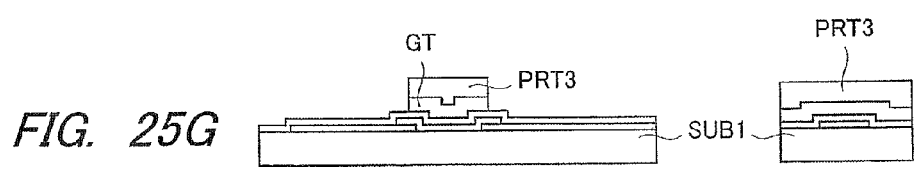
FIG. 25G is a process drawing showing an embodiment of a manufacturing method of a liquid crystal display device having the pixel shown in FIG. 24.

As shown in FIG. 25G, a third photoresist film PRT3 is formed over the surface of the substrate SUB1, and the third photoresist film PRT3 is patterned, thereby leaving the third photoresist film PRT3 in the forming regions of the gate electrode GT and the gate signal line GL connected to the gate electrode GT.

Then, with the left third photoresist film PRT3 as a mask, the third transparent oxide layer TOX3 exposed from the mask is selectively etched. By this means, the gate electrode GT and the gate signal line GL are formed.

Process 8

Figure 25H:
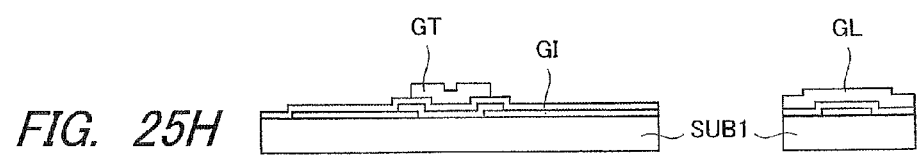
FIG. 25H is a process drawing showing an embodiment of a manufacturing method of a liquid crystal display device having the pixel shown in FIG. 24.

As shown in FIG. 25H, the third photoresist film PRT3 is removed.

Figure 26A:
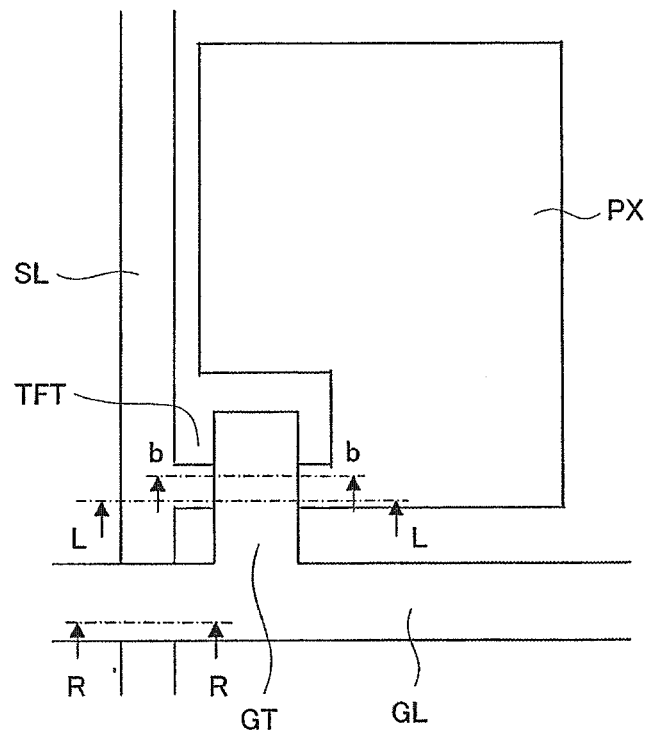
FIG. 26A is a configuration diagram showing another embodiment of the pixel of the display device according to the present invention.

FIG. 26A is a plan view showing another embodiment of the pixel of a display device according to the present invention, and FIG. 26A corresponds to FIG. 23A. Also, the cross-sectional view taken along the line b-b in FIG. 26A is shown in FIG. 26B.

Figure 26B:
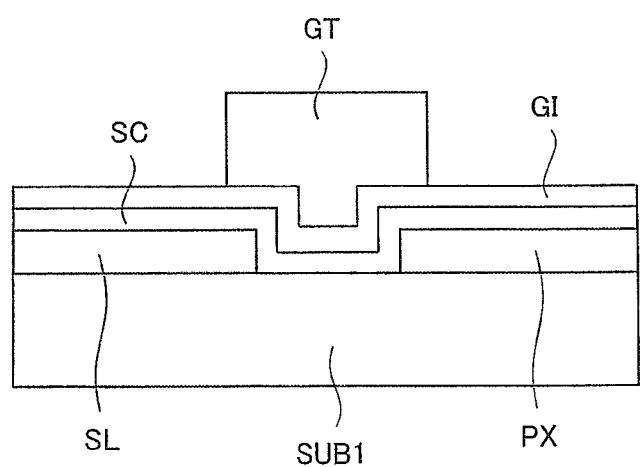
FIG. 26B is a cross-sectional view taken along the line b-b in FIG. 26A.

The configuration of FIG. 26A and FIG. 26B is different from that of FIG. 23A and FIG. 23B in the semiconductor layer SC functioning as a channel region portion of the thin film transistor TFT, and the semiconductor layer SC is formed so as to be stacked not only on the channel region portion of the thin film transistor TFT but also on the source signal line SL, the source region portion ST and the drain region portion DT of the thin film transistor TFT, and the pixel electrode PX.

FIG. 27A to FIG. 27I are process drawings showing an embodiment of the manufacturing method of the display device.

Here, FIG. 27A to FIG. 27I show the process drawings in one pixel of a liquid crystal display region, and the process drawings on the left side of FIG. 27A to FIG. 27I correspond to the cross sections of the line L-L in the pixel shown in FIG. 26A, and the process drawings on the right side of FIG. 27A to FIG. 27I correspond to the cross sections of the line R-R in the pixel shown in FIG. 26A.

The processes will be described below in sequence.

Process 1

Figure 27A:
FIG. 27A is a process drawing showing an embodiment of a manufacturing method of a liquid crystal display device having the pixel shown in FIG. 26A and FIG. 26B.

As shown in FIG. 27A, the substrate SUB1 is prepared, and the first transparent oxide layer TOX1 made of, for example, ZnO doped with an impurity is formed on the surface of the substrate SUB1.

Process 2

Figure 27B:
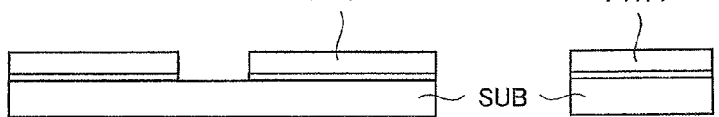
FIG. 27B is a process drawing showing an embodiment of a manufacturing method of a liquid crystal display device having the pixel shown in FIG. 26A and FIG. 26B.

As shown in FIG. 27B, a first photoresist film PRT1 is formed over the surface of the substrate SUB1, and the first photoresist film PRT1 is patterned, thereby leaving the first photoresist film PRT1 having an opening in the region where the semiconductor layer SC of the thin film transistor TFT is to be formed.

Then, with using the left first photoresist film PRT1 as a mask, the first transparent oxide layer TOX1 exposed from the mask is selectively etched.

Process 3

Figure 27C:
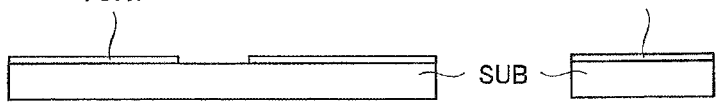
FIG. 27C is a process drawing showing an embodiment of a manufacturing method of a liquid crystal display device having the pixel shown in FIG. 26A and FIG. 26B.

As shown in FIG. 27C, the first photoresist film PRT1 is removed.

Process 4

Figure 27D:
FIG. 27D is a process drawing showing an embodiment of a manufacturing method of a liquid crystal display device having the pixel shown in FIG. 26A and FIG. 26B.

As shown in FIG. 27D, the second transparent oxide layer TOX2 made of, for example, ZnO doped with an intrinsic or low-concentration impurity is formed over the surface of the substrate SUB1.

The second transparent oxide layer TOX2 functions as the semiconductor layer SC of the thin film transistor TFT in the portion where the first transparent oxide layer TOX1 has been selectively etched.

Process 5

Figure 27E:
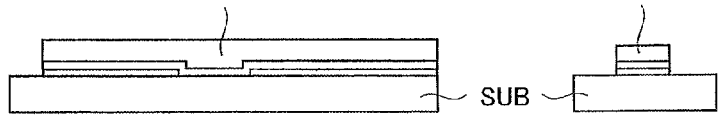
FIG. 27E is a process drawing showing an embodiment of a manufacturing method of a liquid crystal display device having the pixel shown in FIG. 26A and FIG. 26B.

As shown in FIG. 27E, the second photoresist film PRT2 is formed over the surface of the substrate SUB1, and the second photoresist film PRT2 is patterned, thereby leaving the second photoresist film PRT2 in the forming regions of the source signal line SL, the source region portion ST of the thin film transistor TFT, the channel region portion CH, the drain region portion DT, and the pixel electrode PX.

Then, with using the left second photoresist film PRT2 as a mask, the first transparent oxide layer TOX1 exposed from the mask is electively etched.

Process 6

Figure 27F:
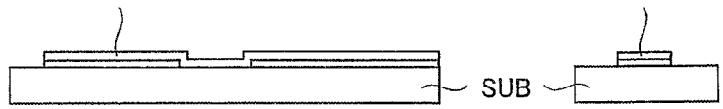
FIG. 27F is a process drawing showing an embodiment of a manufacturing method of a liquid crystal display device having the pixel shown in FIG. 26A and FIG. 26B.

As shown in FIG. 27F, the second photoresist film PRT2 is removed. By this means, the first transparent oxide layer TOX1 constituting the source signal line SL, the source region portion ST of the thin film transistor TFT constituted as the extended portion of the source signal line SL, the pixel electrode PX, and the drain region portion DT of the thin film transistor TFT constituted as the extended portion of the pixel electrode PX is formed on the surface of the substrate SUB1, and the second transparent oxide layer TOX2 is formed in the forming region of the semiconductor layer SC of the thin film transistor TFT (portion of an opening of the first transparent oxide layer TOX1) and on the first transparent oxide layer TOX1.

Process 7

Figure 27G:
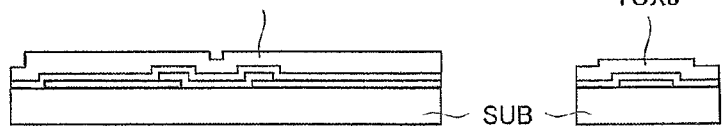
FIG. 27G is a process drawing showing an embodiment of a manufacturing method of a liquid crystal display device having the pixel shown in FIG. 26A and FIG. 26B.

As shown in FIG. 27G, an insulating film GI constituted of, for example, an $SiO_2$ film and a third transparent oxide layer TOX3 constituted of, for example, an ITO film are sequentially formed over the surface of the substrate SUB1.

The insulating film GI functions as a gate insulating film of the thin film transistor TFT and an interlayer insulating film of the later-described gate signal line GL for the source signal line SL.

Process 8

Figure 27H:
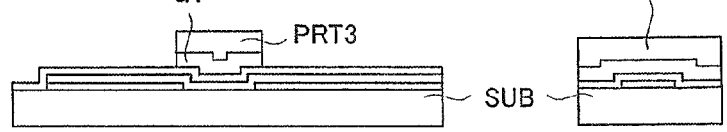
FIG. 27H is a process drawing showing an embodiment of a manufacturing method of a liquid crystal display device having the pixel shown in FIG. 26A and FIG. 26B.

As shown in FIG. 27H, a third photoresist film PRT3 is formed over the surface of the substrate SUB1, and the third photoresist film PRT3 is patterned, thereby leaving the third photoresist film PRT3 in the forming regions of the gate electrode GT and the gate signal line GL connected to the gate electrode GT.

Then, with using the left third photoresist film PRT3 as a mask, the third transparent oxide layer TOX3 exposed from the mask is selectively etched. By this means, the gate electrode GT and the gate signal line GL are formed.

Process 9

Figure 27I:
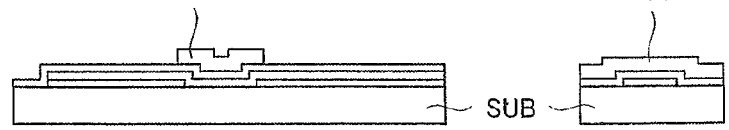
FIG. 27I is a process drawing showing an embodiment of a manufacturing method of a liquid crystal display device having the pixel shown in FIG. 26A and FIG. 26B.

As shown in FIG. 27I, the third photoresist PRT3 is removed.

In the configuration of the pixel shown in FIG. 26, the semiconductor layer SC constituting the channel region portion of the thin film transistor TFT is disposed on the transparent oxide layer constituting the source signal line SL, the source region portion ST and the drain region portion DT of the thin film transistor TFT, and the pixel electrode PX. However, the configuration in which the positional relationship in these layers is reversed is also possible, that is, the configuration may be such that the semiconductor layer SC constituting the channel region portion of the thin film transistor TFT is disposed below the transparent oxide layer constituting the source signal line SL, the source region portion ST and the drain region portion DT of the thin film transistor TFT, and the pixel electrode PX.

A part of the process in an embodiment of the manufacturing method of the pixel with the configuration as described above is shown in FIG. 28A to FIG. 28D.

The processes will be described below in sequence.

Process 1

Figure 28A:
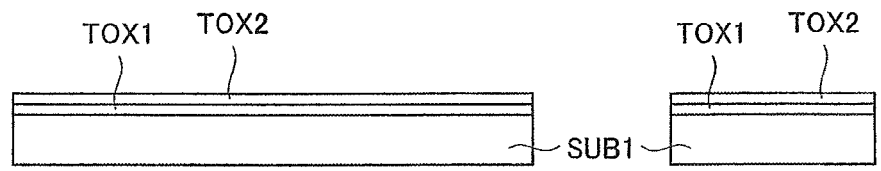
FIG. 28A is a process drawing showing another embodiment of a manufacturing method of a liquid crystal display device having the pixel shown in FIG. 26A and FIG. 26B.

As shown in FIG. 28A, the substrate SUB1 is prepared, and the first transparent oxide layer TOX1 made of, for example, ZnO and the second transparent oxide layer TOX2 made of, for example, ZnO doped with an impurity are sequentially formed on the surface of the substrate SUB1.

Process 2

Figure 28B:
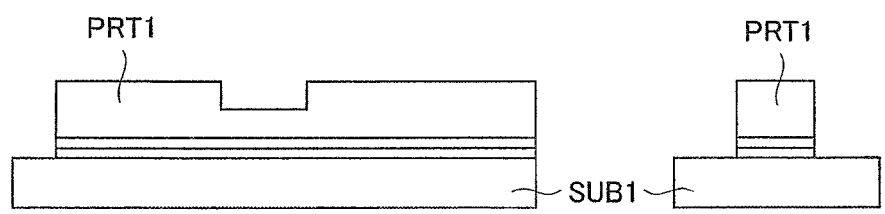
FIG. 28B is a process drawing showing another embodiment of a manufacturing method of a liquid crystal display device having the pixel shown in FIG. 26A and FIG. 26B.

As shown in FIG. 28B, a first photoresist film PRT1 is formed over the surface of the substrate SUB1, and the first photoresist film PRT1 is patterned. By this means, the first photoresist film PRT1 is left in the forming regions of the source signal line SL, the source region portion ST of the thin film transistor TFT constituted as an extended portion of the source signal line SL, the channel region portion CH of the thin film transistor TFT, the pixel electrode PX, and the drain region portion DT of the thin film transistor TFT constituted as an extended portion of the pixel electrode PX, and moreover, the first photoresist film PRT1 is formed to have a thickness smaller in a portion corresponding to the forming region of the channel region portion CH of the thin film transistor TFT than that of other portions.

Then, with using the first photoresist film PRT1 as a mask, the second transparent oxide layer TOX2 and its underlying first transparent oxide layer TOX1 exposed from the mask are selectively etched.

Process 3

Figure 28C:
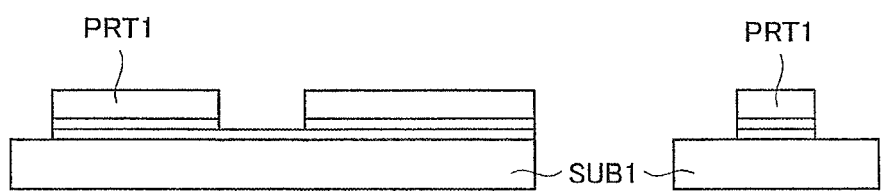
FIG. 28C is a process drawing showing another embodiment of a manufacturing method of a liquid crystal display device having the pixel shown in FIG. 26A and FIG. 26B.

As shown in FIG. 28C, the surface of the first photoresist film PRT1 is removed by an appropriate amount toward the bottom surface thereof, so that the surface of the second transparent oxide layer TOX2 in the forming region of the channel region portion of the thin film transistor TFT is exposed, and the first photoresist PRT1 is left in other portions.

Then, with using the left first photoresist film PRT1 as a mask, the second transparent oxide layer TOX2 in the forming region of the channel region portion of the thin film transistor TFT is selectively etched, and the surface of the first transparent oxide layer TOX1 below the second transparent oxide layer TOX2 is exposed.

Process 4

Figure 28D:
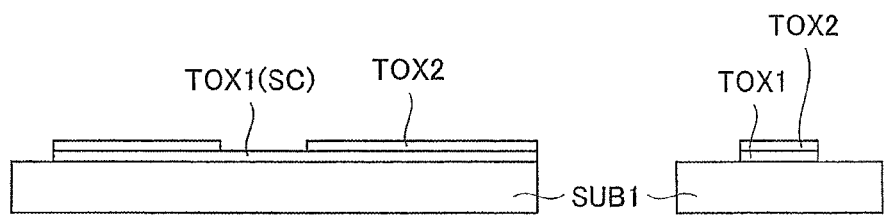
FIG. 28D is a process drawing showing another embodiment of a manufacturing method of a liquid crystal display device having the pixel shown in FIG. 26A and FIG. 26B.

As shown in FIG. 28D, the first photoresist PRT1 is removed. The subsequent process is completed after performing the processes shown in FIG. 27G to FIG. 27I.

Figure 29A:
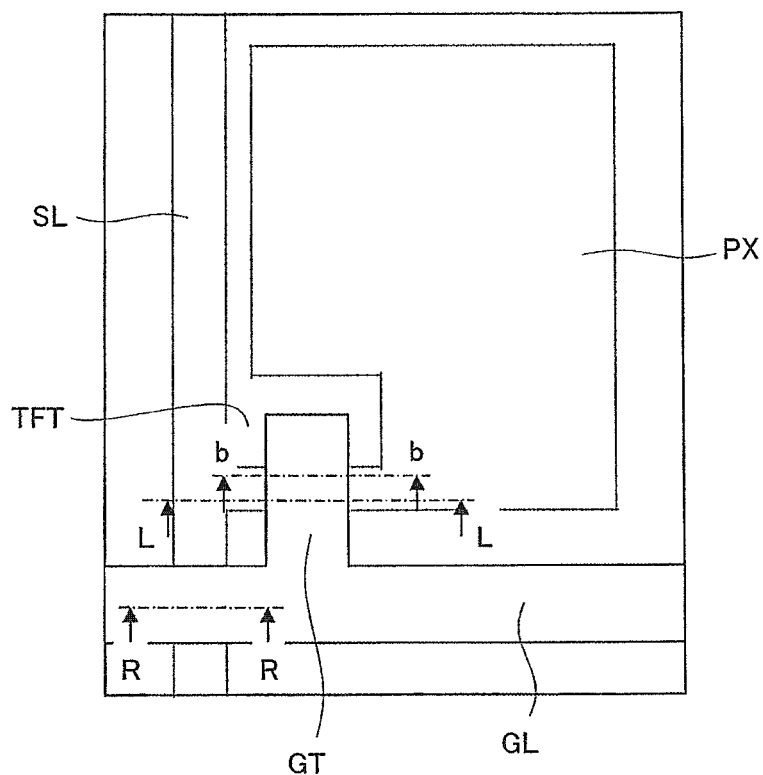
FIG. 29A is a configuration diagram showing another embodiment of the pixel of the display device according to the present invention.

FIG. 29A is a plan view showing another embodiment of the configuration of a pixel of the display device according to the present invention, and FIG. 29A corresponds to FIG. 26A.

Figure 29B:
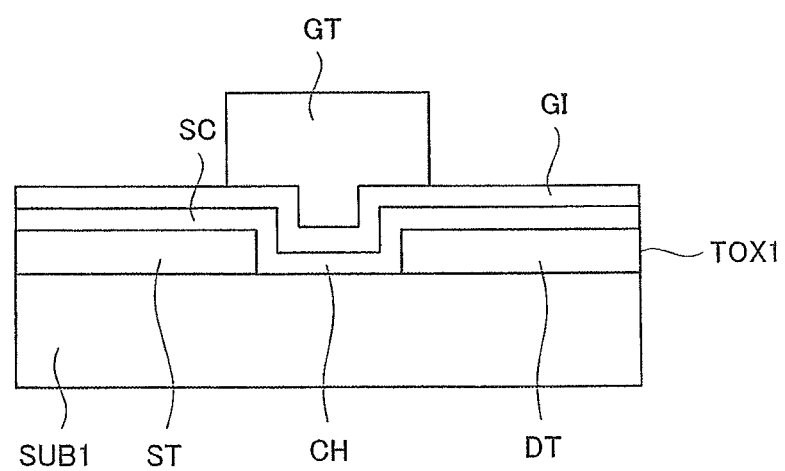
FIG. 29B is a cross-sectional view taken along the line b-b in FIG. 29A.

The configuration of FIG. 29A and FIG. 29B is different from that of FIG. 26A and FIG. 26B in that the second transparent oxide layer TOX2 formed as the semiconductor layer SC of the thin film transistor TFT does not terminate in the vicinity of the channel region portion CH of the thin film transistor TFT, but is formed across the entire region of the pixel region.

Further, in FIG. 29A and FIG. 29B, the first transparent oxide layer TOX1 is formed in each of the forming regions of the source signal line SL, the source region portion ST of the thin film transistor TFT constituted as the extended portion of the source signal line SL, the pixel electrode PX, and the drain region portion DT of the thin film transistor TFT constituted as the extended portion of the pixel electrode PX.

FIG. 30A to FIG. 30F are process drawings showing an embodiment of the manufacturing method of the above-described display device.

Here, FIG. 30A to FIG. 30F show the process drawings in the pixel, and the process drawings shown on the left side of FIG. 30A to FIG. 30F correspond to the cross section of the line L-L in the pixel shown in FIG. 29A, and the process drawings on the right side of FIG. 30A to FIG. 30F correspond to the cross sections of the line R-R in the pixel shown in FIG. 29A.

The processes will be described below in sequence.

Process 1

As shown in FIG. 30A, the substrate SUB1 is prepared, and the first transparent oxide layer TOX1 made of, for example, ZnO doped with an impurity is formed on the surface of the substrate SUB1.

Process 2

As shown in FIG. 30B, a first photoresist film PRT1 is formed over the surface of the substrate SUB1, and the first photoresist film PRT1 is patterned, thereby leaving the first photoresist film PRT1 in the forming regions of the source signal line SL, the source region portion ST of the thin film transistor TFT constituted as an extended portion of the source signal line SL, the pixel electrode PX, and the drain region portion DT of the thin film transistor TFT constituted as an extended portion of the pixel electrode PX.

Then, with using the left first photoresist film PRT1 as a mask, the first transparent oxide layer TOX1 exposed from the mask is selectively etched.

Process 3

As shown in FIG. 30C, the first photoresist film PRT1 is removed.

Process 4

As shown in FIG. 30D, the semiconductor layer SC made of, for example, ZnO doped with an intrinsic or low-concentration impurity and the insulating film GI constituted of, for example, an $SiO_2$ film are sequentially formed over the surface of the substrate SUB1.

The semiconductor layer SC functions as a semiconductor layer in the forming region of the thin film transistor TFT, and the insulating film GI functions as a gate insulating film of the thin film transistor TFT and an interlayer insulating film of the later-described gate signal line GL for the source signal line SL.

Thereafter, the second transparent oxide layer TOX2 made of, for example, ITO is formed over the surface of the substrate SUB1.

Process 5

As shown in FIG. 30E, the second photoresist film PRT2 is formed over the surface of the substrate SUB1, and the second photoresist film PRT2 is patterned, thereby leaving the second photoresist film PRT2 in the forming regions of the gate electrode GT and the gate signal line GL connected to the gate electrode GT.

Then, with using the left second photoresist film PRT2 as a mask, the second transparent oxide layer TOX2 exposed from the mask is electively etched. By this means, the gate electrode GT and the gate signal line GL are formed.

Process 6

As shown in FIG. 30F, the second photoresist film PRT2 is removed.

Eighth Embodiment

Figure 31A:
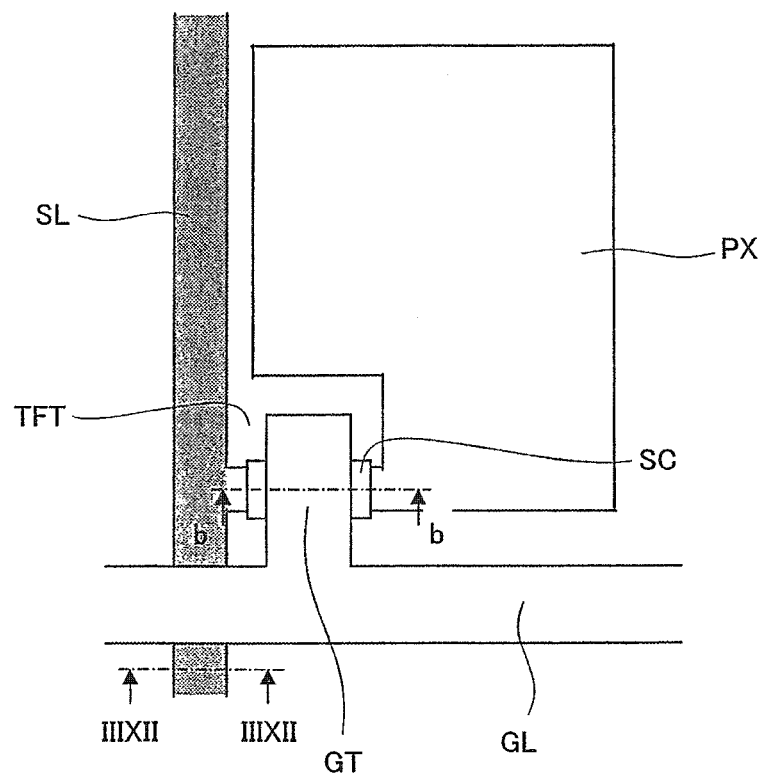
FIG. 31A is a configuration diagram showing another embodiment of the pixel of the display device according to the present invention.

FIG. 31A is a plan view showing another embodiment of the configuration of a pixel of a display device according to the present invention, and FIG. 31A corresponds to FIG. 23A. Also, FIG. 31B is a cross-sectional view taken along the line b-b in FIG. 31A.

Figure 31B:
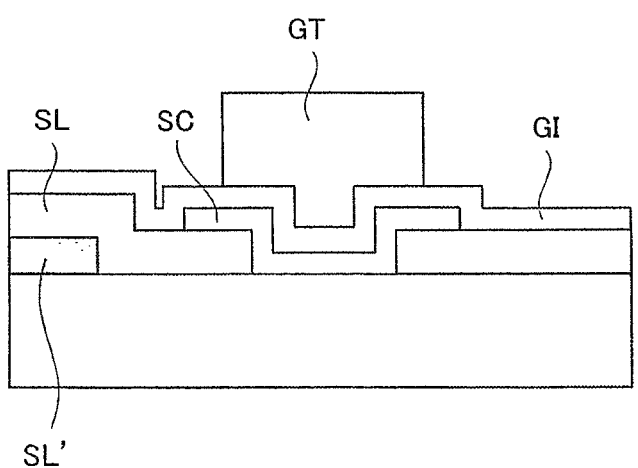
FIG. 31B is a cross-sectional view taken along the line b-b in FIG. 31A.

The configuration of FIG. 31A and FIG. 31B is different from that of FIG. 23A and FIG. 23B in that a new source signal line SL' is provided to be overlapped with a source signal line SL formed from a transparent oxide layer.

More specifically, the source signal line SL' is constituted of, for example, a metal layer and formed on the surface of a substrate SUB1.

Then, the configuration shown in FIG. 23A and FIG. 23B is formed over the surface of the substrate SUB1 on which the source signal line SL' is formed, and the source signal line SL is overlapped on the source signal line SL'.

In such a configuration, the source signal line of a multi-layered structure including the metal layer can be obtained, so that the electric resistance of the source signal line can be significantly reduced.

A part of the process in an embodiment of the manufacturing method of the display device with the configuration as described above is shown in the process drawings in FIG. 32A and FIG. 32B, and FIG. 32A and FIG. 32B are cross-sectional views taken along the line IIIXII-IIIXII in FIG. 31A.

Figure 32A:
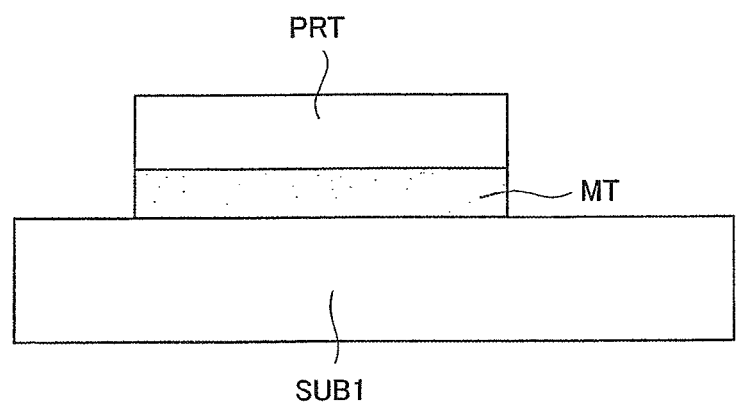
FIG. 32A is a process drawing showing the manufacturing method of the display device having the pixel shown in FIG. 31A and FIG. 31B.

First, as shown in FIG. 32A, the substrate SUB1 is prepared, and a metal layer MT is formed on the entire region of the surface of the substrate SUB1, and a photoresist film PRT is formed on the surface of the metal layer MT. Then, the photoresist film PRT is patterned, thereby leaving the photoresist film PRT in the forming region of the source signal line SL'.

Then, with using the photoresist film PRT as a mask, the metal layer MT exposed from the mask is selectively etched.

Figure 32B:
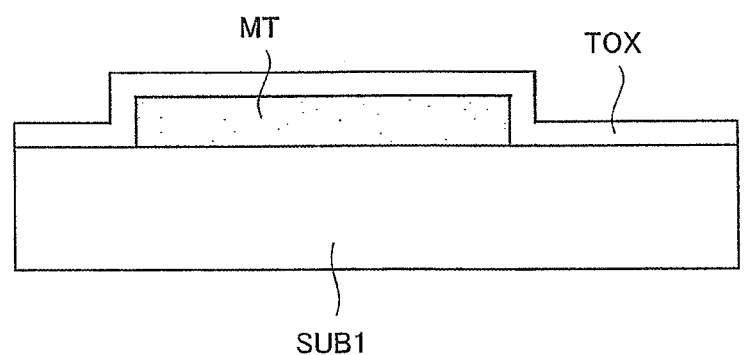
FIG. 32B is a process drawing showing the manufacturing method of the display device having the pixel shown in FIG. 31A and FIG. 31B.

Next, as shown in FIG. 32B, the photoresist film PRT is removed, and the transparent oxide layer TOX made of, for example, ZnO doped with an impurity is formed over the surface of the substrate SUB1. The formation of the transparent oxide layer TOX corresponds to the process of FIG. 25A, and thereafter, by performing the processes of FIG. 25B to FIG. 25H, the pixel shown in FIG. 31 can be completed.

In the configuration shown in FIG. 31, the source signal line SL of the transparent oxide layer is stacked on the almost entire region in the longitudinal direction of the source signal line SL' constituted of a metal layer. However, the source signal line SL of the transparent oxide layer is not always required to be formed across the almost entire length of the source signal line SL', and for example, it may be formed only in the vicinity of the thin film transistor TFT. This is because the electric resistance of the source signal line can be reduced even in this configuration.

Also, in the configuration shown in FIG. 31, the source signal line SL' constituted of a metal layer is formed below the source signal line SL of the transparent oxide layer. However, the source signal line SL' constituted of a metal layer can be formed on the source signal line SL of the transparent oxide layer.

Figure 33A:
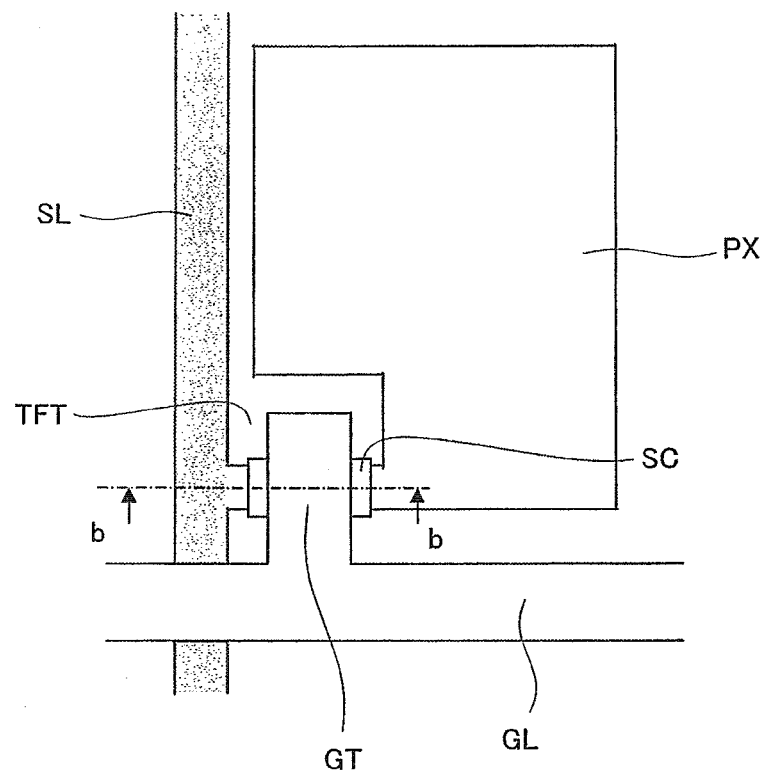
FIG. 33A is a configuration diagram showing another embodiment of the pixel of the display device according to the present invention.
Figure 33B:
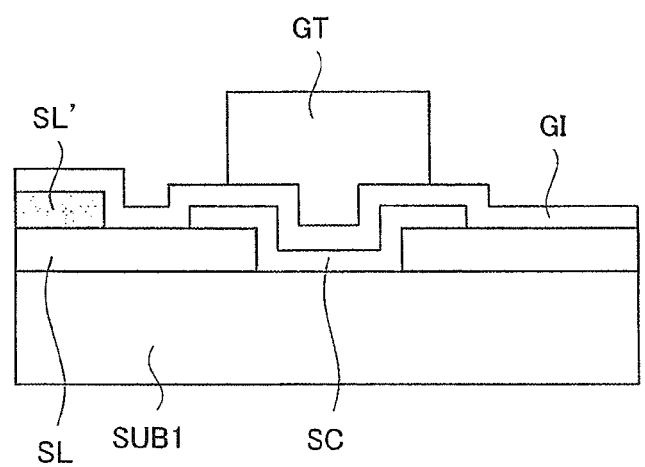
FIG. 33B is a cross-sectional view taken along the line b-b in FIG. 33A.

FIG. 33A and FIG. 33B are configuration diagrams showing an embodiment of the case where the source signal line SL' is formed on the source signal line SL, and FIG. 33A and FIG. 33 correspond to FIG. 31A and FIG. 31B.

Ninth Embodiment

Figure 34A:
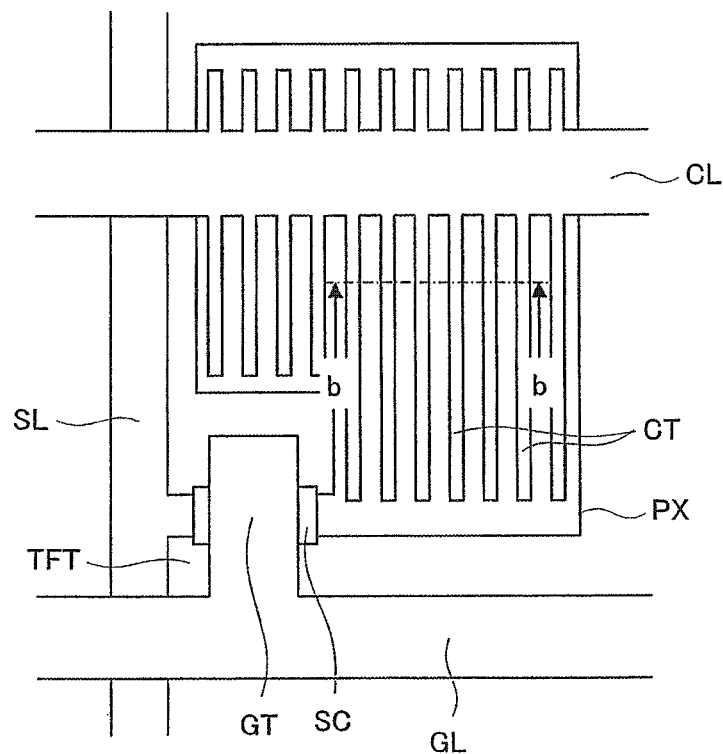
FIG. 34A is a configuration diagram showing another embodiment of the pixel of the display device according to the present invention.
Figure 34B:
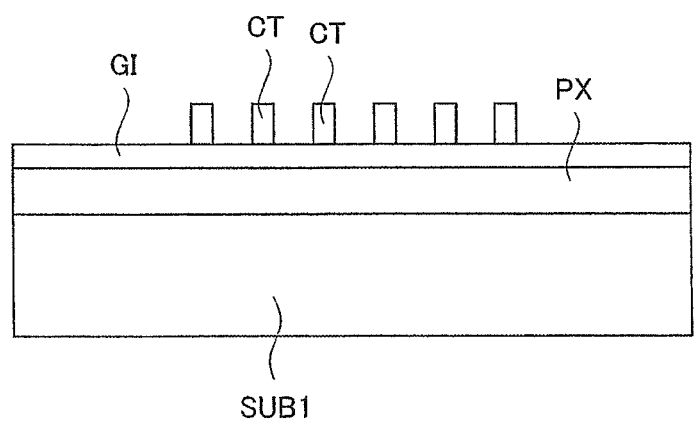
FIG. 34B is a cross-sectional view taken along the line b-b in FIG. 34A.

FIG. 34A is a plan view showing another embodiment of the configuration of a pixel of a display device according to the present invention, and FIG. 34A corresponds to FIG. 23A. Also, FIG. 34B is a cross-sectional view taken along the line b-b in the FIG. 34A.

The configuration of FIG. 34A is different from that of FIG. 23A in that the counter electrode CT generating an electric field with the pixel electrode PX and the common signal line CL supplying the signal having a voltage serving as a reference for a video signal to the counter electrode CT are provided over the surface of the substrate SUB1.

The counter electrode CT is overlapped on the pixel electrode PX via the insulating film GI, and a number of counter electrodes CT disposed in parallel to one another form an electrode group and are integrally formed with the common signal line CL.

Also, the counter electrode CT and the common signal line CL are formed in the same layer as, for example, the gate signal line GL.

Further, the counter electrode CT and the common signal line CL may be formed of a metal layer. Alternatively, for example, as shown in FIG. 21, the counter electrode CT and the common signal line CL may be selectively formed together with the gate signal line GL (gate electrode GT) in the transparent oxide layer formed across the entire region of the pixel.

Figure 35:
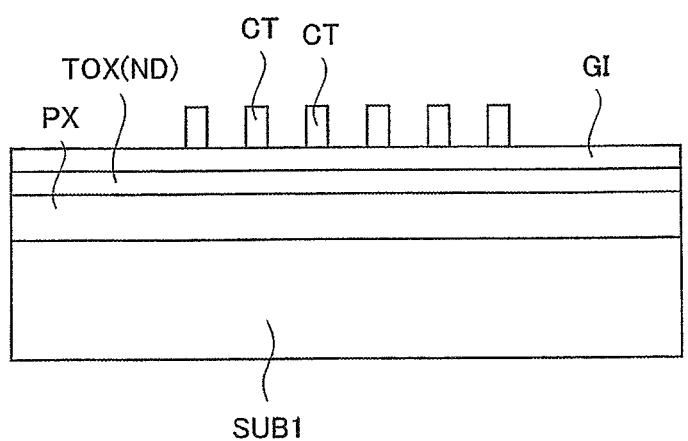
FIG. 35 is a configuration diagram showing another embodiment of the pixel of the display device according to the present invention.

Also, as shown in FIG. 35 which corresponds to FIG. 34B, a transparent oxide layer TOX (ND) not doped with an impurity may be interposed between the insulating film GI and the pixel electrode PX. The transparent oxide layer TOX (ND) functions as, for example, a semiconductor layer SC in the forming region of the thin film transistor TFT, and it is not selectively removed and is formed over the region of the pixel.

Tenth Embodiment

Figure 36:
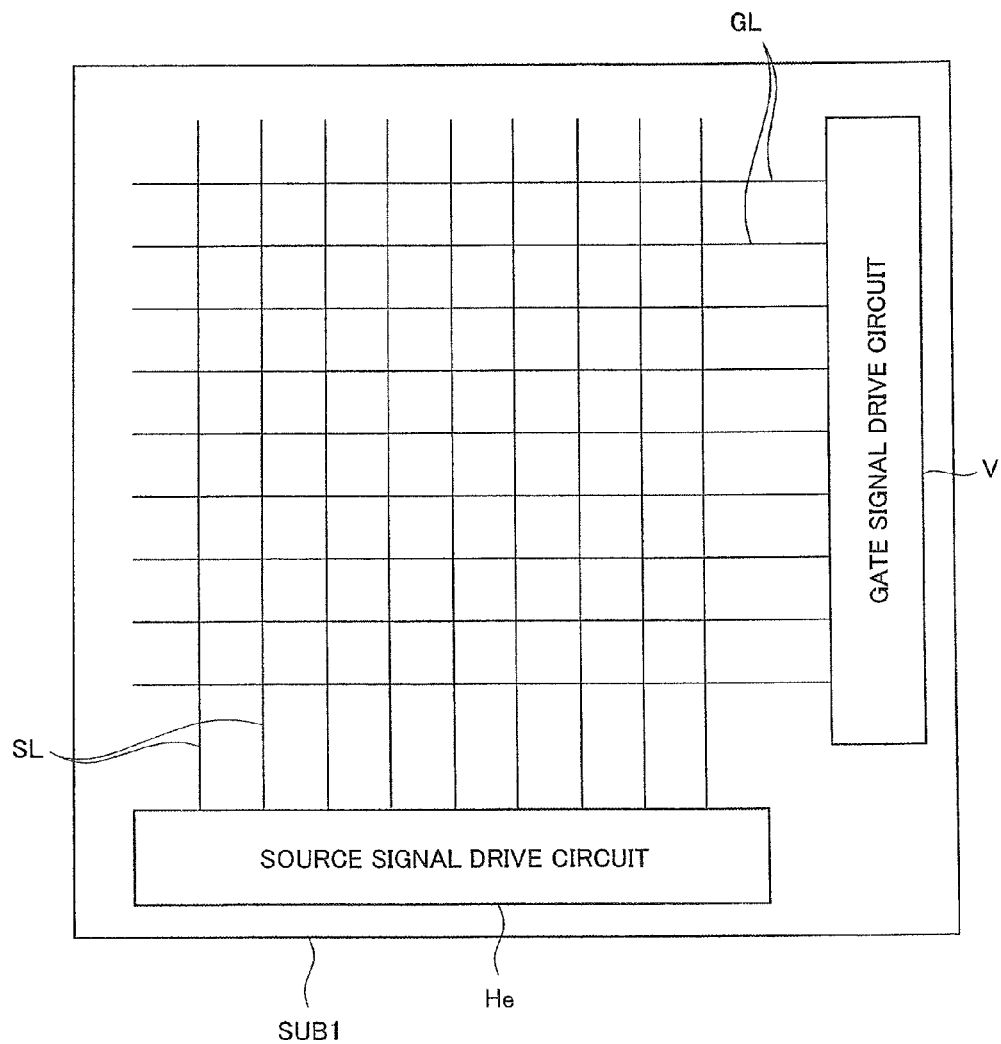
FIG. 36 is an explanatory drawing showing that a signal drive circuit is mounted on the substrate in the display device according to the present invention.

FIG. 36 shows that the pixel with the above-described configuration (not shown) is formed on the substrate SUB 1, and at the same time, the supply of the scanning signal to each gate signal line GL is performed by a gate signal drive circuit V mounted on the substrate SUB1, and the supply of a video signal to each source signal line SL is performed by a source signal drive circuit He mounted on the substrate SUB1.

The gate signal line GL may be formed of a single film of molybdenum, chromium, tungsten, aluminum, copper, titanium, nickel, tantalum, silver, zinc, or other metal, an alloy film made of these metals, a stacked film of these metals, or a stacked film of these films and a transparent oxide layer made of ITO, ZnO or the like.

Also, when the source signal line SL is formed of a film with a multilayered structure of a transparent oxide layer and a metal layer, the metal layer may be formed of a single film of molybdenum, chromium, tungsten, aluminum, copper, titanium, nickel, tantalum, silver, zinc or other metal, a stacked film of these metals, or an alloy film of these metals.

Although not shown in FIG. 36, when the counter electrode CT generating an electric field with the pixel electrode PX is formed on the substrate SUB1, the counter electrode CT or the common signal line CL supplying the signal to the counter electrode CT may be formed of a single film of molybdenum, chromium, tungsten, aluminum, copper, titanium, nickel, tantalum, silver, zinc or other metal, a stacked film of these metals, an alloy film of these metals or a stacked film of these films and a transparent oxide layer of ITO, ZnO, or the like.

The substrate SUB may be formed as a flexible substrate made of, for example, synthetic resin or stainless instead of the general glass substrate. This is because, since the materials that can be formed at a low temperature are used, synthetic resin can be used as the material of the substrate SUB1.

The above-described display device and the manufacturing method thereof can be applied not only to each liquid crystal display device of a transmission type, a reflection type, a half-transmission type, an IPS type, and an IPS-Pro type but also to other display devices such as an organic EL display device. This is because the display devices provided with a thin film transistor for each pixel and performing an active matrix drive have the same problem to be solved.

The above-described embodiments may be used independently and in combination. This is because the effects of the respective embodiments can be achieved independently and synergistically.

What is claimed is:

1. A method of manufacturing a display device where a transparent oxide layer, an insulating film, and a conductive layer are sequentially stacked on a pixel region on a substrate, the method comprising the steps of:
    forming the conductive layer which has a gate electrode of a thin film transistor connected to a gate signal line; and
    converting a region of the transparent oxide layer other than at least a channel region portion directly below the gate electrode into an electrically conductive region by performing processing for selectively forming a region with a high carrier concentration and a region with a low carrier concentration in a separated manner using a mask pattern.

2. The method of manufacturing a display device according to claim 1, wherein the processing is any one selected from a group consisting of light irradiation, thermal annealing, the implantation of ion and impurity doping, or a combination of the processings selected from the group.

3. The method of manufacturing a display device according to claim 1, wherein the mask pattern is formed by a photolithography process which uses a photoresist.

4. The method of manufacturing a display device according to claim 1, wherein the mask pattern is an electrode pattern.

5. A method of manufacturing a display device where a transparent oxide layer, an insulating film, and a conductive layer are sequentially stacked on a pixel region on a substrate, the method comprising the steps of:
    forming a mask pattern in a region other than a region with a high carrier concentration in a region of a surface of the transparent oxide layer; and
    performing processing for improving a carrier concentration in a region of the transparent oxide layer where the mask pattern is not formed.

6. The method of manufacturing a display device according to claim 5, wherein the processing for improving the carrier concentration is any one selected from a group consisting of light irradiation, thermal annealing, implantation of ion and impurity doping, or a combination of processings selected from the group.

7. A method of manufacturing a display device where a transparent oxide layer and a semiconductor layer are formed on a pixel region on a substrate with either one of the transparent oxide layer and the semiconductor layer forming an upper layer, and an insulating film and a conductive layer are sequentially stacked on either one of the transparent oxide layer and the semiconductor layer, the method comprising the steps of:
    forming the conductive layer which has a gate electrode of a thin film transistor connected to a gate signal line; and
    converting the transparent oxide layer having an opening portion or a notched portion in at least a channel region portion directly below the gate electrode into an electrically conductive region by performing processing for selectively forming a region with a high carrier concentration and a region with a low carrier concentration in a separated manner using a mask pattern; and
    forming the semiconductor layer in the opening portion or the notched portion of the transparent oxide layer and connecting the semiconductor layer to the source region portion and the drain region portion.

8. The method of manufacturing a display device according to claim 7, wherein the processing for converting a region into an electrically conductive region is any one selected from a group consisting of light irradiation, thermal annealing, implantation of ion and impurity doping, or a combination of the processings selected from the group.

* * * * *